United States Patent
Shi et al.

(10) Patent No.: US 12,055,633 B2
(45) Date of Patent: Aug. 6, 2024

(54) PACKAGE FOR A TIME OF FLIGHT DEVICE

(71) Applicant: Lumentum Operations LLC, San Jose, CA (US)

(72) Inventors: Wei Shi, San Jose, CA (US); Huanlin Zhu, San Jose, CA (US); Lijun Zhu, Dublin, CA (US); Raman Srinivasan, San Jose, CA (US); Ed Murphy, West Hartford, CT (US)

(73) Assignee: Lumentum Operations LLC, San Jose, CA (US)

( * ) Notice: Subject to any disclaimer, the term of this patent is extended or adjusted under 35 U.S.C. 154(b) by 906 days.

(21) Appl. No.: 17/109,943

(22) Filed: Dec. 2, 2020

(65) Prior Publication Data

US 2022/0066036 A1 Mar. 3, 2022

Related U.S. Application Data

(60) Provisional application No. 63/091,115, filed on Oct. 13, 2020, provisional application No. 62/706,559, filed on Aug. 25, 2020.

(51) Int. Cl.
*G01S 17/89* (2020.01)
*G01S 7/4865* (2020.01)
*G03B 17/02* (2021.01)
*H01S 5/183* (2006.01)
*H05K 9/00* (2006.01)

(52) U.S. Cl.
CPC .......... *G01S 17/89* (2013.01); *G01S 7/4865* (2013.01); *G03B 17/02* (2013.01); *H01S 5/183* (2013.01); *H05K 9/0007* (2013.01)

(58) Field of Classification Search
CPC ........ G01S 17/89; G01S 7/4865; G01S 5/183; H01L 25/16
See application file for complete search history.

(56) References Cited

U.S. PATENT DOCUMENTS

| | | | | |
|---|---|---|---|---|
| 9,461,001 | B1* | 10/2016 | Tsai | H01L 25/0655 |
| 10,892,748 | B1* | 1/2021 | Kanai | H01L 23/50 |
| 2004/0238857 | A1* | 12/2004 | Beroz | H01L 24/49 |
| | | | | 257/E23.092 |
| 2008/0237589 | A1* | 10/2008 | Negishi | H01L 23/5385 |
| | | | | 438/109 |
| 2009/0014847 | A1* | 1/2009 | Chen | H01L 23/3135 |
| | | | | 257/659 |
| 2009/0260872 | A1* | 10/2009 | Chen | H01L 23/552 |
| | | | | 174/546 |
| 2011/0140262 | A1* | 6/2011 | Lee | H01L 23/4334 |
| | | | | 257/E23.101 |
| 2011/0229708 | A1* | 9/2011 | Asami | H01L 24/97 |
| | | | | 428/316.6 |
| 2011/0248389 | A1* | 10/2011 | Yorita | H01L 25/0652 |
| | | | | 257/659 |
| 2012/0020039 | A1* | 1/2012 | Coffy | H01L 25/16 |
| | | | | 29/829 |

(Continued)

*Primary Examiner* — Nathan W Ha
(74) *Attorney, Agent, or Firm* — Harrity & Harrity, LLP

(57) ABSTRACT

In some implementations, a housing for an electro-optical device comprises a molded dielectric structural component, an electromagnetic interference (EMI) shield, and a plurality of conductive traces. The molded dielectric structural component may be configured to separate the EMI shield and the plurality of conductive traces.

20 Claims, 11 Drawing Sheets

(56) References Cited

U.S. PATENT DOCUMENTS

| | | | |
|---|---|---|---|
| 2012/0062439 A1* | 3/2012 | Liao | H01L 23/481 29/25.01 |
| 2012/0187551 A1* | 7/2012 | Kushino | H01L 24/97 257/659 |
| 2014/0035032 A1* | 2/2014 | Korec | H01L 29/66181 438/237 |
| 2015/0071643 A1* | 3/2015 | Shi | G02B 6/4204 398/116 |
| 2016/0300799 A1* | 10/2016 | Han | H01L 21/6835 |
| 2016/0381262 A1* | 12/2016 | Shi | H04N 13/239 348/47 |
| 2017/0092633 A1* | 3/2017 | Tomonari | H01L 25/18 |
| 2017/0098634 A1* | 4/2017 | Kumar | H01L 25/50 |
| 2017/0117229 A1* | 4/2017 | Kumbhat | H01L 21/561 |
| 2017/0186697 A1* | 6/2017 | Dias | H01L 23/552 |
| 2017/0301628 A1* | 10/2017 | Kawabata | H01L 21/32051 |
| 2017/0309576 A1* | 10/2017 | Kawabata | H01L 25/16 |
| 2017/0311448 A1* | 10/2017 | Kawabata | H01L 23/3121 |
| 2017/0315314 A1* | 11/2017 | Mizrahi | G02B 6/4246 |
| 2017/0353004 A1* | 12/2017 | Chen | H01S 5/02234 |
| 2018/0033738 A1* | 2/2018 | Kawabata | H01L 23/49838 |
| 2018/0108618 A1* | 4/2018 | Yamamoto | C23C 14/14 |
| 2018/0204781 A1* | 7/2018 | Otsubo | H01L 23/552 |
| 2018/0269181 A1* | 9/2018 | Yang | H01L 25/0652 |
| 2019/0019763 A1* | 1/2019 | Chang | H01L 21/561 |
| 2019/0027676 A1* | 1/2019 | Yasuda | H10N 30/877 |
| 2019/0074267 A1* | 3/2019 | Yang | H01L 25/16 |
| 2019/0104653 A1* | 4/2019 | Jandzinski | H01L 21/561 |
| 2019/0164904 A1* | 5/2019 | Katsumata | H01L 21/486 |
| 2019/0172791 A1* | 6/2019 | Kawabata | H01L 23/49805 |
| 2019/0267301 A1* | 8/2019 | Yazaki | H05K 9/0075 |
| 2019/0267339 A1* | 8/2019 | Murase | H01L 25/16 |
| 2019/0273079 A1* | 9/2019 | Gong | H01L 23/3157 |
| 2019/0273312 A1* | 9/2019 | Otsubo | H05K 9/00 |
| 2019/0289758 A1* | 9/2019 | Furuya | H05K 5/065 |
| 2019/0304936 A1* | 10/2019 | Shaul | H01L 24/20 |
| 2019/0318973 A1* | 10/2019 | Okada | H01L 23/5389 |
| 2019/0378779 A1* | 12/2019 | Fujii | H01L 23/498 |
| 2019/0393166 A1* | 12/2019 | Otsubo | H01L 23/552 |
| 2020/0006172 A1* | 1/2020 | Otsubo | H01L 25/04 |
| 2020/0008325 A1* | 1/2020 | Otsubo | H05K 1/0216 |
| 2020/0013729 A1* | 1/2020 | Washida | H01F 17/0013 |
| 2020/0022250 A1* | 1/2020 | Otsubo | H01L 25/16 |
| 2020/0091582 A1* | 3/2020 | Maggay | H01Q 1/40 |
| 2020/0118913 A1* | 4/2020 | Matsukawa | H01L 23/552 |
| 2020/0161252 A1* | 5/2020 | Yang | H01L 21/561 |
| 2020/0168572 A1* | 5/2020 | Lin | H01L 23/5389 |
| 2020/0185354 A1* | 6/2020 | Iwamoto | H01L 24/85 |
| 2020/0203287 A1* | 6/2020 | Krefft | H01L 21/4814 |
| 2020/0203288 A1* | 6/2020 | Otsubo | H05K 3/28 |
| 2020/0203291 A1* | 6/2020 | Uejima | H01L 25/16 |
| 2020/0203325 A1* | 6/2020 | Lee | H01L 24/20 |
| 2020/0204159 A1* | 6/2020 | Onodera | H03H 9/25 |
| 2020/0211977 A1* | 7/2020 | Kim | H01L 21/6835 |
| 2020/0227365 A1* | 7/2020 | Tseng | H01L 21/4817 |
| 2020/0235067 A1* | 7/2020 | Kim | H01L 24/73 |
| 2020/0251459 A1* | 8/2020 | Tsuda | H01L 23/66 |
| 2020/0253040 A1* | 8/2020 | Dalmia | H05K 1/0243 |
| 2020/0258797 A1* | 8/2020 | Nomura | H01L 23/552 |
| 2020/0281102 A1* | 9/2020 | Otsubo | H05K 1/0215 |
| 2020/0337187 A1* | 10/2020 | Otsubo | H05K 1/0213 |
| 2020/0343151 A1* | 10/2020 | Nomura | H01L 25/16 |
| 2020/0365476 A1* | 11/2020 | Otsubo | H05K 9/00 |
| 2020/0381336 A1* | 12/2020 | Otsubo | H01L 23/552 |
| 2021/0043544 A1* | 2/2021 | Eid | H03H 9/02834 |
| 2021/0118806 A1* | 4/2021 | Tai | H01L 25/18 |
| 2021/0159186 A1* | 5/2021 | Ryu | H01L 23/552 |
| 2021/0225776 A1* | 7/2021 | Wu | H01L 23/5383 |
| 2021/0233848 A1* | 7/2021 | Chung | H01L 23/5383 |
| 2021/0257311 A1* | 8/2021 | Hsieh | H01L 23/5385 |
| 2021/0358859 A1* | 11/2021 | Chen | H01L 25/16 |
| 2022/0013472 A1* | 1/2022 | Han | H01L 23/647 |
| 2022/0223541 A1* | 7/2022 | Lin | H01L 23/49822 |
| 2022/0236381 A1* | 7/2022 | Steinmann | H01L 25/167 |
| 2022/0246488 A1* | 8/2022 | Shibata | H01L 23/552 |
| 2022/0254695 A1* | 8/2022 | Guo | H05K 1/185 |
| 2023/0027279 A1* | 1/2023 | Shi | H01S 5/423 |
| 2023/0046942 A1* | 2/2023 | Dolganov | G01S 7/4815 |
| 2023/0361096 A1* | 11/2023 | Shi | H01S 5/02208 |

\* cited by examiner

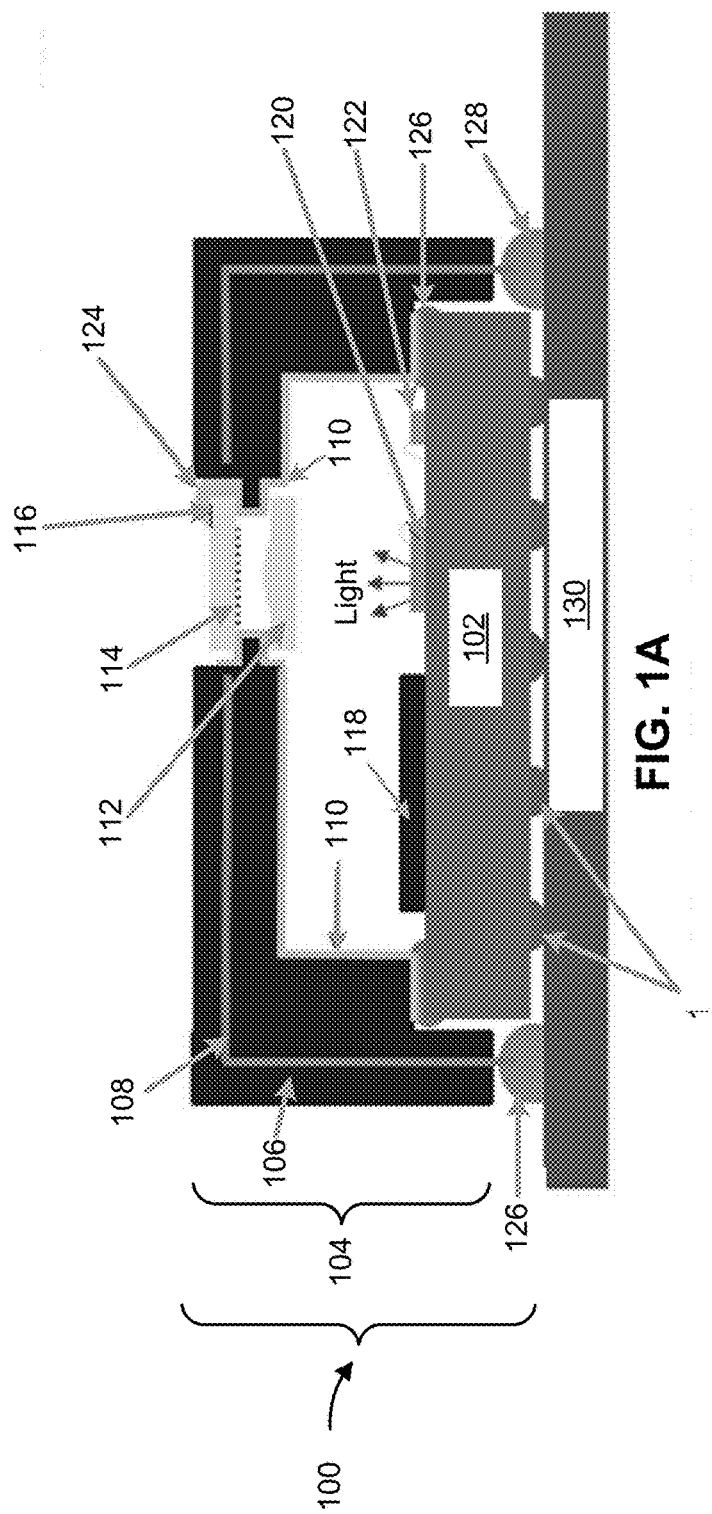
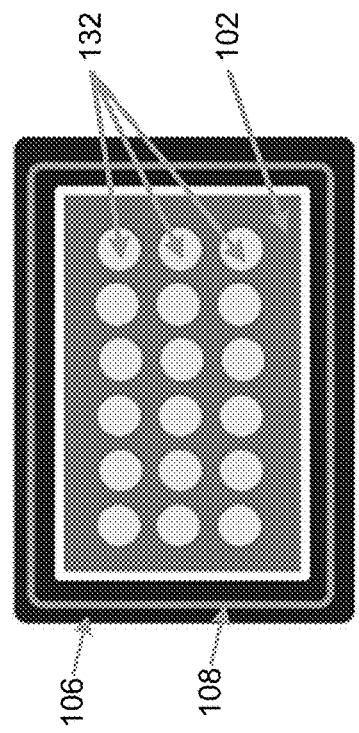
FIG. 1A
FIG. 1B

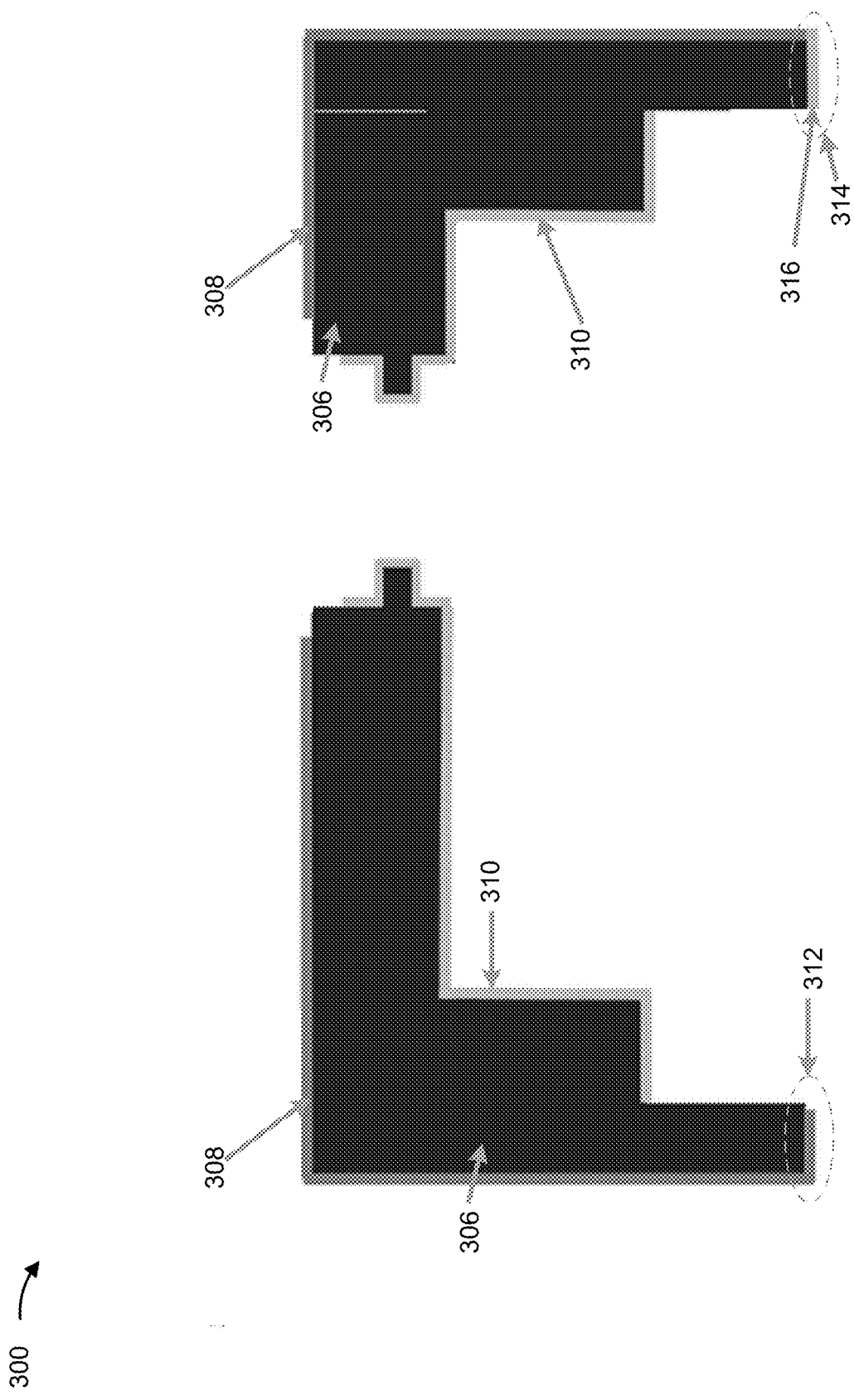

PACKAGE FOR A TIME OF FLIGHT DEVICE

RELATED APPLICATION

This application claims priority to U.S. Provisional Patent Application No. 62/706,559, for "INTEGRATED EMI SHIELDING AND ITO CONNECTION FOR HOUSING OF TOF CAMERA," filed on Aug. 25, 2020, and to U.S. Provisional Patent Application No. 63/091,115, for "INTEGRATED EMI SHIELDING AND ITO CONNECTION FOR HOUSING OF TOF CAMERA," filed on Oct. 13, 2020, the content of which is incorporated by reference herein in its entirety.

TECHNICAL FIELD

The present disclosure relates generally to a time-of-flight (ToF) device and to a package for a ToF device.

BACKGROUND

ToF systems, such as three-dimensional (3D) sensing systems, light detection and ranging (LIDAR) systems, and/or the like, emit optical pulses into a field of view, detect reflected optical pulses, and determine distances to objects in the field of view by measuring delays and/or differences between the emitted optical pulses and the reflected optical pulses.

SUMMARY

In some implementations, a housing for an electro-optical device includes a molded dielectric structural component; an electromagnetic interference (EMI) shield; and a plurality of conductive traces, wherein the molded dielectric structural component is configured to separate the EMI shield and the plurality of conductive traces.

In some implementations, a package for an electro-optical device includes a substrate, and a housing comprising: at least one optical element, a dielectric component, an EMI shield, and a plurality of conductive traces, wherein the dielectric component is configured to separate the EMI shield and the plurality of conductive traces.

In some implementations, a package for a ToF device includes a substrate comprising a vertical cavity surface emitting laser (VCSEL) array disposed on a surface of the substrate; and a housing comprising: at least one optical element, a dielectric component, an EMI shield disposed on an exterior surface of the dielectric component, and a conductive trace disposed on an interior surface of the dielectric component.

BRIEF DESCRIPTION OF THE DRAWINGS

FIGS. 1A-1B are diagrams of an example package for an electro-optical device described herein.

FIGS. 3A-3B are diagrams showing side cut-away views of an example housing for a package of an electro-optical device described herein.

DETAILED DESCRIPTION

Figure 2A:
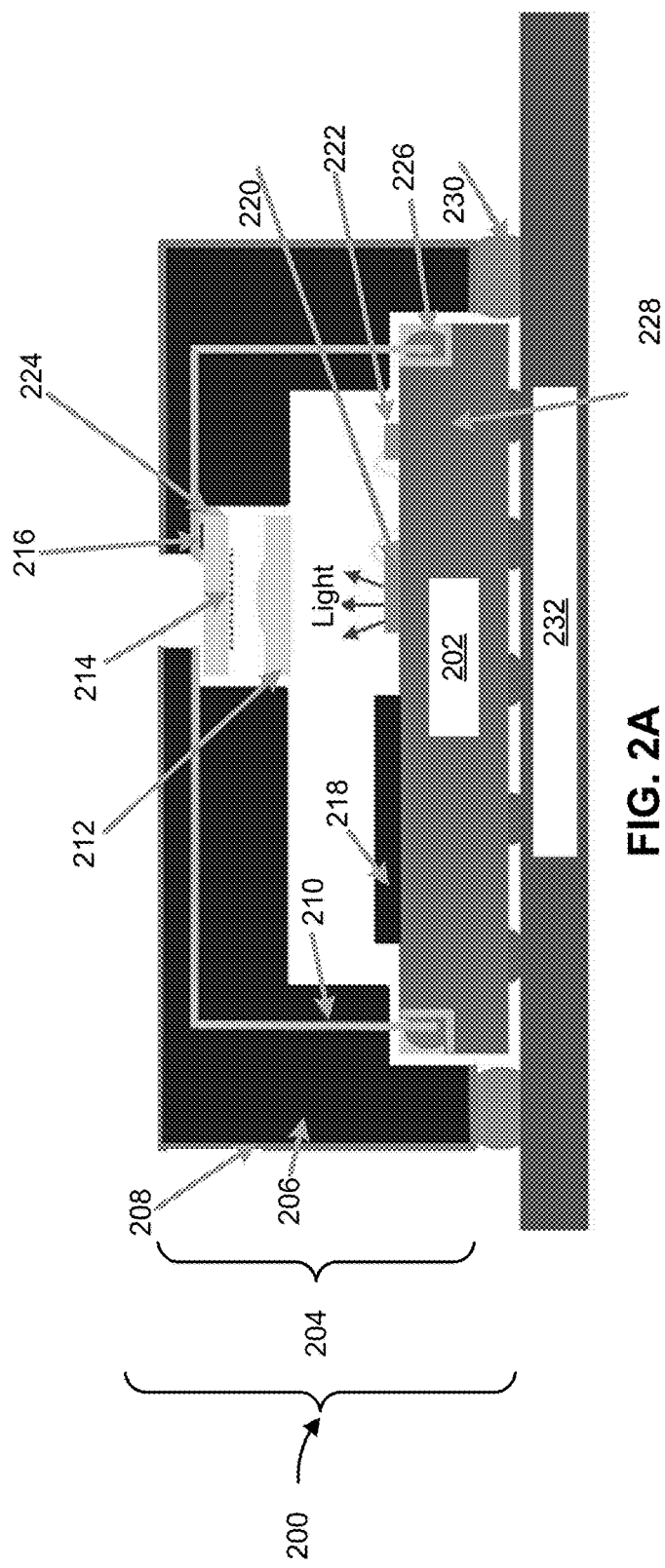
FIGS. 2A-2B are diagrams of an example package for an electro-optical device described herein.

The following detailed description of example implementations refers to the accompanying drawings. The same reference numbers in different drawings may identify the same or similar elements.

A 3D sensing ToF device, such as a ToF camera, may include an emitter array (e.g., a vertical-cavity surface-emitting laser (VCSEL) array), a lens, and a diffractive optical element (DOE). In operation, light emitted by emitters of the emitter array (e.g., infrared (IR) light) is collimated by the lens, and beams of collimated light (each corresponding to a respective emitter) are directed to the DOE. The DOE distributes the collimated beams of light in order to create a dot projection (e.g., a projection of the collimated beams) on a subject. More specifically, the DOE diffracts a given beam of light such that diffracted orders of the given beam are transmitted by the DOE at different angles. The 3D sensing ToF device may include one or more additional elements (e.g., one or more sensors, processors, and/or the like) to sense the dot projection and make one or more measurements concerning the subject based on the dot projection.

Typically, the DOE includes a glass or silicon substrate that includes a transparent, conductive circuit formed as a layer on a surface of the substrate. The circuit is configured to detect a change in resistance associated with damage to the glass substrate (e.g., when the glass substrate is broken, broken off from the DOE, and/or the like). The circuit typically comprises Indium Tin Oxide (ITO) and is bonded to a package (e.g., a plastic package) of the 3D sensing ToF device via two ITO terminal pads that are connected to a pair of laser direct structuring (LDS) traces that are formed on a surface of the package. The LDS traces are connected to an integrated circuit (IC) driver of the 3D sensing ToF device. When the circuit detects a change in resistance, the IC driver will shut down the emitter array (e.g., to prevent further emission of light by the emitters of the emitter array for eye safety compliance).

In some cases, the 3D sensing ToF camera includes electromagnetic interference (EMI) shielding (e.g., a metal that is soldered on top of the package substrate to cover the 3D sensing ToF device). The EMI shielding is often larger than the 3D sensing ToF device and not integrated into the package of the 3D sensing ToF device, and therefore increases a form factor (e.g., in terms of width, height, length, and/or volume, among other examples) of the 3D sensing ToF device.

Some implementations described herein provide a package for an electro-optical device, such as a ToF device. In some implementations, the package may comprise a housing that includes an EMI shield and one or more conductive traces separated by a dielectric component. The one or more conductive traces may be electrically connected to a substrate of the package and a conductive path associated with an optical element held by the housing. By integrating both the EMI shield and the one or more conductive traces into the housing, some implementations described herein provide a smaller form factor of the package than would otherwise be possible using the conventional technique of covering a housing that includes one or more conductive traces with an EMI shield. Moreover, some implementations described herein enable the substrate of the package and the housing of the package to be assembled before integrating the package with the electro-optical device (e.g., affixing the package to the electro-optical device), which improves and simplifies an assembly process associated with the package, as opposed to affixing a substrate to the electro-optical device, affixing a package housing on the electro-optical device, and affixing an EMI shield on top of the package housing.

In some implementations, a substrate of a package may include a VCSEL array that is configured to emit light that is to propagate out of the package via one or more optical elements of the housing. A photodiode of the substrate may detect an amount of light that is reflected by the one or more optical elements and may determine that the one or more optical elements have become damaged based on a change in the amount of reflected light. Accordingly, some implementations described herein provide a housing of the package that does not include conductive traces, which further improves and simplifies an assembly process associated with the package.

Moreover, some implementations described herein enable passive and/or active alignment of the package (e.g., alignment of the one or more optical elements of the housing with the VCSEL array of the substrate). For example, some implementations described herein allow the one or more optical elements to be aligned within the housing and then allow the housing to be aligned on the substrate. As another example, some implementations described herein allow the one or more optical elements to be aligned within the housing, the housing to be aligned on the substrate, and the alignment of one or more optical elements within the housing to be adjusted based on analyzing a dot projection created by causing the VCSEL array to emit light. In this way, some implementations described herein enable an improved performance of the electro-optical device (e.g., by producing a high-quality dot projection).

FIGS. 1A-1B are diagrams of an example package 100 for an electro-optical device, such as a ToF device. FIG. 1A illustrates a side cut-away view of the package 100 and FIG. 1B illustrates a bottom view of the package 100. As shown in FIGS. 1A-1B, the package 100 includes a substrate 102 (e.g., a printed circuit board) and a housing 104 (e.g., a package housing). The housing 104 may include a dielectric component 106, an EMI shield 108, and/or one or more conductive traces 110 (e.g., one or more laser direct structuring (LDS) traces).

The dielectric component 106 may comprise a molded dielectric polymer (e.g., that forms a molded dielectric structural component). As shown in FIG. 1A, the EMI shield 108 may be disposed within the dielectric component 106 (e.g., the EMI shield 108 may be insert molded into the dielectric component 106). The EMI shield 108 may comprise a metal, such as copper (Cu), nickel (Ni), gold (Au), and/or stainless steel, among other examples. As further shown in FIG. 1A, a conductive trace 110, of the one or more conductive traces 110, may be disposed on an interior surface of the dielectric component 106 (e.g., the conductive trace 110 may be coated, deposited, plated, or formed on a surface of the dielectric component 106 that faces the substrate 102) and may comprise a metal, such as Cu, Ni, and/or Au, among other examples. In some implementations, the housing 104 may include one or more optical elements, such as a lens 112 (e.g., a collimating lens) and/or a DOE 114 (e.g., a diffuser), and/or a conductive path 116 associated with the one or more optical elements (e.g., to facilitate detection of damage to the one or more optical elements, as described above). The conductive path 116 may comprise, for example, indium tin oxide (ITO).

In some implementations, an integrated circuit 118 (e.g., a driving circuit), a VCSEL array 120 (e.g., comprising one or more VCSELs), and/or a photodiode 122 may be disposed on a surface of the substrate 102 (e.g., a top surface of the substrate 102 as shown in FIG. 1A). The integrated circuit 118 may provide a driving current to allow the VCSEL array 120 to produce light that emits from the housing 104 via the one or more optical elements (e.g., via the lens 112 and/or the DOE 114). The photodiode 122 may collect light reflected by the one or more optical elements to facilitate determining whether the one or more optical elements are damaged (e.g., as described above).

As further shown in FIG. 1A, a connecting material 124 may be configured to physically (e.g., structurally) connect the conductive path 116 and/or the one or more optical elements (e.g., the DOE 114) to the dielectric component 106. Additionally, or alternatively, the connecting material 124 may be configured to electrically connect the conductive path 116 to a conductive trace 110, of the one or more conductive traces 110. For example, the connecting material 124 may include a conductive epoxy (e.g., that comprises silver (Ag)). In some implementations, a portion of the conductive trace 110 and a portion of the conductive path 116 may contact the connecting material 124.

As further shown in FIG. 1A, a connecting material 126 may be configured to physically (e.g., structurally) connect the conductive trace 110 to the substrate 102. Additionally, or alternatively, the connecting material 126 may be configured to electrically connect the conductive trace 110 to the substrate 102. For example, the connecting material 126 may include a conductive epoxy (e.g., that comprises Ag). In some implementations, an additional portion of the conductive trace 110 and a portion of the substrate 102 may contact the connecting material 126. Accordingly, the conductive trace 110 may be configured to provide an electrical connection between the substrate 102 and the conductive path 116 (e.g., via the connecting material 124 and the connecting material 126).

As further shown in FIG. 1A, a connecting material 128 may be configured to physically (e.g., structurally) connect the dielectric component 106 and/or the EMI shield 108 (e.g., that is disposed within the dielectric component 106) to a substrate 130 of a user device (e.g., a user device, such as a smart phone, that includes the package 100). Additionally, or alternatively, the connecting material 128 may be configured to electrically connect the EMI shield 108 to the substrate 130 of the user device. For example, the connecting material 128 may include a high-conductivity solder (e.g., a solder paste). In some implementations, a portion of the EMI shield 108 (e.g., a surface of the EMI shield 108 that contacts the connecting material 128) may be configured to bond with the connecting material 128 and/or the substrate 130 of the user device.

As shown in FIG. 1B, which shows a bottom view of the package 100, the substrate 102 may be surrounded by the dielectric component 106 and the EMI shield 108 (e.g., that is disposed within the dielectric component 106). In some implementations, the dielectric component 106 and/or the EMI shield 108 may encapsulate the substrate 102 (e.g., with an opening for the one or more optical components) to form the package 100. As further shown in FIG. 1B, a connecting material 132 (e.g., shown as a plurality of solder balls) may be configured to physically (e.g., structurally) connect the substrate 102 to the substrate 130 of the user device.

In some implementations, a method to form the housing 104 may include using an insert molding process (e.g., that includes a liquid crystal polymer (LCP) injection molding process or other polymer injection molding process) to dispose the EMI shield 108 (e.g., that comprises a metal) within the dielectric component 106 (e.g., that comprises a molded dielectric polymer). The method may further include coating or depositing the one or more conductive traces 110 on an interior surface of the dielectric component 106. The method may include affixing the one or more optical elements (e.g., that include the lens 112 and/or the DOE 114) and/or the conductive path 116 to the dielectric component 106 and/or the one or more conductive traces 110 (e.g., using the connecting material 124).

In some implementations, a method for assembling the package 100 may include affixing the housing 104 to the substrate 102 by connecting the one or more conductive traces 110 to the substrate 102 (e.g., using the connecting material 126). The method may further include affixing the housing 104 to the substrate 130 of the user device by connecting the dielectric component 106 and/or the EMI shield 108 to the substrate 130 of the user device (e.g., using the connecting material 128). In some implementations, the method may include affixing the housing 104 to the substrate 102 and/or the substrate 130 of the user device using a passive alignment technique (e.g., where the one or more optical elements of the housing 104 are aligned over the VCSEL array 120 without monitoring light that emits from the package 100 via the VCSEL array 120 and the one or more optical elements) and/or an active alignment technique (e.g., where the one or more optical elements of the housing 104 are aligned over the VCSEL array 120 while monitoring an optical power, a diffraction pattern, and/or the like of the light that emits from the package 100 via the VCSEL array 120 and the one or more optical elements). The method may further include attaching the substrate 102 to the substrate 130 of the user device by affixing the substrate 102 to the substrate 130 of the user device (e.g., using the connecting material 132).

As indicated above, FIGS. 1A-1B are provided as an example. Other examples may differ from what is described with regard to FIGS. 1A-1B.

Figure 2B:
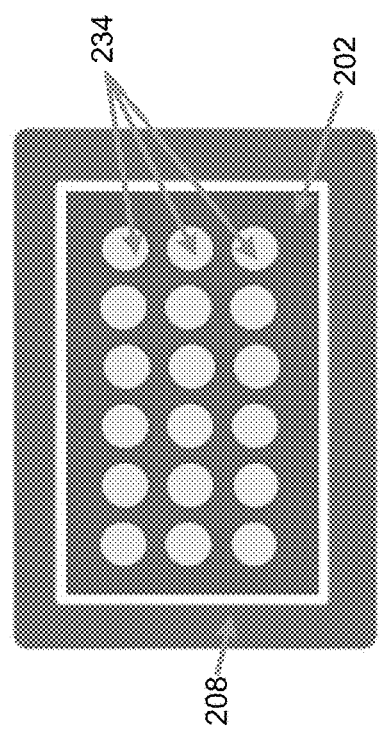

FIGS. 2A-2B are diagrams of an example package 200 for an electro-optical device, such as a ToF device. FIG. 2A illustrates a side cut-away view of the package 200, and FIG. 2B illustrates a bottom view of the of the package 200. As shown in FIGS. 2A-2B, the package 200 includes a substrate 202 (e.g., a printed circuit board) and a housing 204 (e.g., a package housing). The housing 204 may include a dielectric component 206, an EMI shield 208, and/or one or more conductive traces 210 (e.g., one or more LDS traces).

The dielectric component 206 may comprise a molded dielectric polymer (e.g., that forms a molded dielectric structural component). As shown in FIG. 2A, the EMI shield 208 may be disposed on an exterior surface of the dielectric component 206 (e.g., the EMI shield 208 may be coated, deposited, plated, or formed on a surface of the dielectric component 206 that does not face the substrate 202). The EMI shield 208 may comprise a metal, such as Cu, Ni, and/or Au, among other examples. As further shown in FIG. 2A, a conductive trace 210, of the one or more conductive traces 210, may be disposed within the dielectric component 206 (e.g., the conductive trace 210 may be insert molded into the dielectric component 206) and may comprise a metal, such as Cu, Ni, and/or Au, among other examples. In some implementations, the housing 204 may include one or more optical elements, such as a lens 212 (e.g., a collimating lens) and/or a DOE 214 (e.g., a diffuser), and/or a conductive path 216 associated with the one or more optical elements (e.g., to facilitate detection of damage to the one or more optical elements, as described above). The conductive path 216 may comprise, for example, ITO.

In some implementations, an integrated circuit 218 (e.g., a driving circuit), a VCSEL array 220 (e.g., comprising one or more VCSELs), and/or a photodiode 222 may be disposed on a surface of the substrate 202 (e.g., a top surface of the substrate 202 as shown in FIG. 2A). The integrated circuit 218 may provide a driving current to allow the VCSEL array 220 to produce light that emits from the housing 204 via the one or more optical elements (e.g., via the lens 212 and/or the DOE 214). The photodiode 222 may collect light reflected by the one or more optical elements to facilitate determining whether the one or more optical elements are damaged (e.g., as described above).

As further shown in FIG. 2A, a connecting material 224 may be configured to physically (e.g., structurally) connect the conductive path 216 and/or the one or more optical elements (e.g., the DOE 214) to a conductive trace 210, of the one or more conductive traces 210 (e.g., a surface of the conductive trace 210 that extends from the dielectric component 206). Additionally, or alternatively, the connecting material 224 may be configured to electrically connect the conductive path 216 to the conductive trace 210. For example, the connecting material 224 may include a conductive epoxy (e.g., that comprises Ag). In some implementations, a portion of the conductive trace 210 and a portion of the conductive path 216 may contact the connecting material 224.

As further shown in FIG. 2A, a connecting material 226 may be configured to physically (e.g., structurally) connect the conductive trace 210 to the substrate 202. Additionally, or alternatively, the connecting material 226 may be configured to electrically connect the conductive trace 210 to the substrate 202. For example, the connecting material 226 may include a conductive epoxy (e.g., that comprises Ag). In some implementations, an additional portion of the conductive trace 210 and a portion of the substrate 202 (e.g., shown in FIG. 2A as a "step" cut-out of the substrate 202) may contact the connecting material 226. The portion of the substrate 202 may be plated with a metal (e.g., with Cu, Ni, and/or Au) or an additional conductive trace 228 (e.g., that has a same or similar composition of the conductive trace 210) may be disposed on the portion of the substrate 202 (e.g., the additional conductive trace 228 may be coated, deposited, plated, or formed on the portion of the substrate 202). Accordingly, the conductive trace 210 may be configured to provide an electrical connection between the substrate 202 and the conductive path 216 (e.g., via the additional conductive trace 228, the connecting material 224, and the connecting material 226).

As further shown in FIG. 2A, a connecting material 230 may be configured to physically (e.g., structurally) connect the EMI shield 208 (e.g., that is disposed on the dielectric component 206) to a substrate 232 of a user device (e.g., a user device, such as a smart phone, that includes the package 200). Additionally, or alternatively, the connecting material 230 may be configured to electrically connect the EMI shield 208 to the substrate 232 of the user device. For example, the connecting material 230 may include a high-viscosity and/or high-conductivity solder (e.g., a solder paste). In some implementations, a portion of the EMI shield 208 (e.g., a surface of the EMI shield 208 that contacts the connecting material 230) may be configured to bond with the connecting material 230 and/or the substrate 232 of the user device. For example, the portion of the EMI shield 208 may be plated with a metal, such as Cu, Ni, and/or Au.

As shown in FIG. 2B, which shows a bottom view of the package 200, the substrate 202 may be surrounded by the EMI shield 208 (e.g., that is disposed on an exterior surface of the dielectric component 206). In some implementations, the dielectric component 206 and/or the EMI shield 208 may encapsulate the substrate 202 (e.g., with an opening filled by the one or more optical components) to form the package 200. As further shown in FIG. 2B, a connecting material 234 (e.g., shown as a plurality of solder balls) may be configured to physically (e.g., structurally) connect the substrate 202 to the substrate 232 of the user device.

In some implementations, a method for forming the housing 204 may include using an insert molding process (e.g., that includes an LCP injection molding process or other polymer injection molding process) to form the one or more conductive traces 210 (e.g., that comprise a metal) disposed within the dielectric component 206 (e.g., that comprises a molded dielectric polymer). The method may include coating or depositing the EMI shield 208 on an exterior surface of the dielectric component 206. The method may include affixing the one or more optical elements (e.g., that include the lens 212 and/or the DOE 214) and/or the conductive path 216 to the dielectric component 206 and/or the one or more conductive traces 210 (e.g., using the connecting material 224).

In some implementations, a method for assembling the package 200 may include affixing the housing 204 to the substrate 202 by connecting the one or more conductive traces 210 to the substrate 202 (e.g., using the connecting material 226). The method may include affixing the housing 204 to the substrate 232 of the user device by connecting the dielectric component 206 and/or the EMI shield 208 to the substrate 232 of the user device (e.g., using the connecting material 230). In some implementations, the method may include affixing the housing 204 to the substrate 202 and/or the substrate 232 of the user device using a passive alignment technique (e.g., where the one or more optical elements of the housing 204 are aligned over the VCSEL array 220 without monitoring light that emits from the package 200 via the VCSEL array 220 and the one or more optical elements) and/or an active alignment technique (e.g., where the one or more optical elements of the housing 204 are aligned over the VCSEL array 220 while monitoring an optical power, a diffraction pattern, and/or the like of the light that emits from the package 200 via the VCSEL array 220 and the one or more optical elements). The method may include attaching the substrate 202 to the substrate 232 of the user device by affixing the substrate 202 to the substrate 232 of the user device (e.g., using the connecting material 230).

As indicated above, FIGS. 2A-2B are provided as an example. Other examples may differ from what is described with regard to FIGS. 2A-2B.

FIGS. 3A-3B are diagrams showing side cut-away views of an example housing 300 for a package of an electro-optical device, such as a ToF device. As shown in FIGS. 3A-3B, the housing 300 may include a dielectric component 306, an EMI shield 308, and/or one or more conductive traces 310 (e.g., one or more LDS traces). The dielectric component 306 may comprise a molded dielectric polymer (e.g., that forms a molded dielectric structural component). As shown in FIGS. 3A-3B, the EMI shield 308 may be disposed on an exterior surface of the dielectric component 306 (e.g., the EMI shield 308 may be coated, deposited, plated, or formed on the exterior surface of the dielectric component 306). The EMI shield 308 may comprise a metal, such as Cu, Ni, Au, and/or stainless steel, among other examples. As further shown in FIGS. 3A-3B, a conductive trace 310, of the one or more conductive traces 310, may be disposed on an interior surface of the dielectric component 306 (e.g., the conductive trace 310 may be coated, deposited, plated, or formed on the interior surface of the dielectric component 306).

As shown in FIG. 3A, in a first example configuration, the EMI shield 308 may be disposed on a bottom portion 312 of the dielectric component 306. Accordingly, a portion of the EMI shield 308 (e.g., that is associated with the bottom portion 312 of the dielectric component 306) may contact a substrate (not shown in FIG. 3A) associated with the housing 300 (e.g., when the housing 300 is assembled as part of a package). As further shown in FIG. 3B, in a second example configuration, a conductive trace 316, comprised of the same material, or a similar material, as the one or more conductive traces 310, may be disposed on a bottom portion 314 of the dielectric component 306 and may be in contact with the EMI shield 308. Accordingly, the conductive trace 316 (e.g., that is associated with the bottom portion 314 of the dielectric component 306) may contact a substrate (not shown in FIG. 3B) associated with the housing 300 (e.g., when the housing 300 is assembled as part of a package).

In some implementations, a method for forming the housing 300 may include using an injection molding process (e.g., that includes an LCP injection molding process or other polymer injection molding process) to form the dielectric component 306 (e.g., that comprises a molded dielectric polymer). The method may further include using a coating process to coat the EMI shield 308 on an exterior surface of the dielectric component 306 and to coat the one or more conductive traces 310 on an interior surface of the dielectric component 306. The method may further include depositing the EMI shield 308 on the bottom portion 312 and/or the conductive trace 316 on the bottom portion 314. For example, the method may include using a selective coating process to deposit metal that comprises the EMI shield 308 on the exterior surface of the dielectric component 306 and to deposit metal that comprises the one or more conductive traces 310 on the interior surface of the dielectric component 306. As another example, the method may include applying a global coating process to apply a metal coating on the exterior surface and the interior surface of the dielectric component 306 and using a laser ablation process and/or other removal processes (e.g., to remove excess metal coating) to form the EMI shield 308 and the one or more conductive traces 310.

In some implementations, the method for forming the housing 300 may include using an injection molding process (e.g., that includes an LCP injection molding process or other polymer injection molding process) to form the EMI shield 308 (e.g., that comprises a molded conductive polymer). The method may further include using the injection molding process to form the dielectric component 306 (e.g., that comprises a molded dielectric polymer) on the EMI shield 308 (e.g., such that the EMI shield 308 is disposed on an external surface of the dielectric component 306 after the dielectric component 306 is formed) and a coating process to form the one or more conductive traces 310 (e.g., on an interior surface of the dielectric component 306). Alternatively, the method may further include using a coating process to form the dielectric component 306 (e.g., that comprises a dielectric film) on the EMI shield 308 (e.g., such that the EMI shield 308 is disposed on an external surface of the dielectric component 306 after the dielectric component 306 is formed) and a coating process to form the one or more conductive traces 310 (e.g., on an interior surface of the dielectric component 306).

As indicated above, FIGS. 3A-3B are provided as an example. Other examples may differ from what is described with regard to FIGS. 3A-3B.

Figure 4:
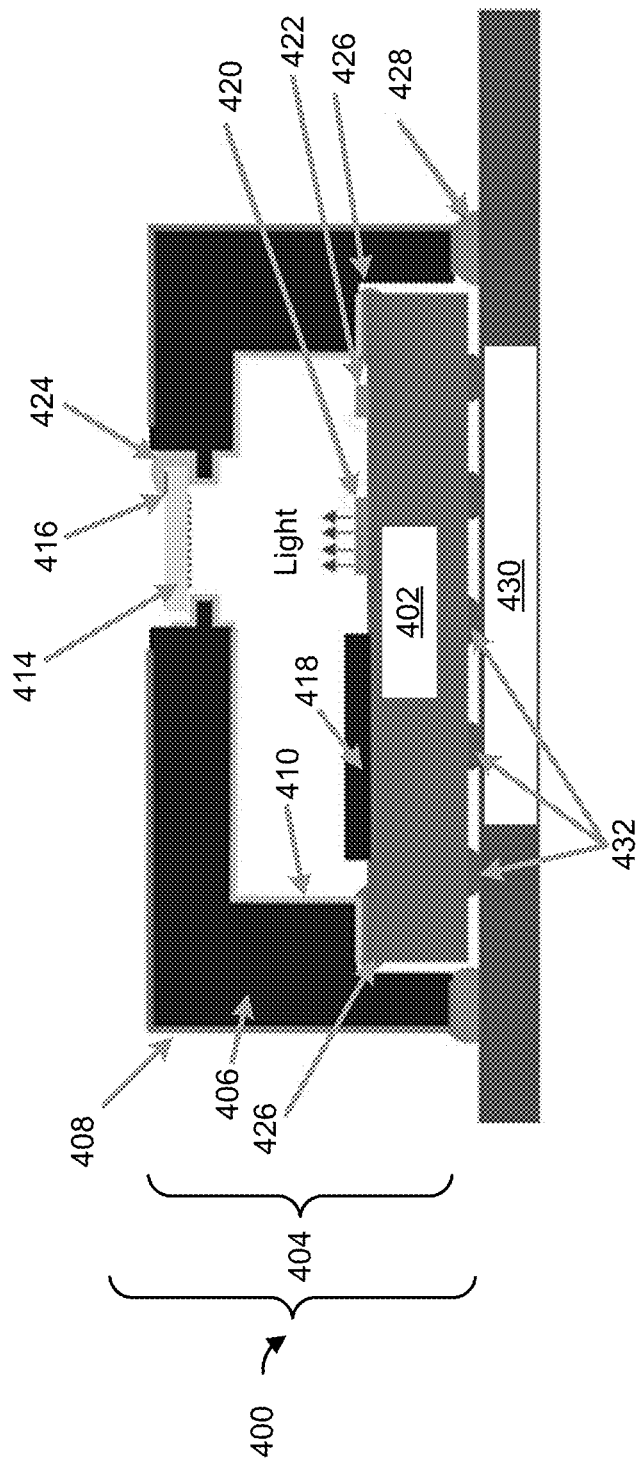
FIG. 4 is a diagram of an example package for an electro-optical device described herein.

FIG. 4 is a diagram of an example package 400 for an electro-optical device, such as a ToF device. FIG. 4 illustrates a side cut-away view of the package 400. As shown in FIG. 4, the package 400 includes a substrate 402 (e.g., a printed circuit board) and a housing 404 (e.g., a package housing). The housing 404 may include a dielectric component 406, an EMI shield 408, and/or one or more conductive traces 410 (e.g., one or more LDS traces). The housing 404 has a similar configuration to that described herein in relation to housing 300 shown in FIGS. 3A-3B.

The dielectric component 406 may comprise a molded dielectric polymer (e.g., that forms a molded dielectric structural component) or a dielectric film. As shown in FIG. 4, the EMI shield 408 may be disposed on an exterior surface of the dielectric component 406 (e.g., the EMI shield 408 may be coated or molded on a surface of the dielectric component 406 that does not face the substrate 402). The EMI shield 408 may comprise a metal, such as Cu, Ni, and/or Au, among other examples. As further shown in FIG. 4, a conductive trace 410, of the one or more conductive traces 410, may be disposed on an interior surface of the dielectric component 406 (e.g., the conductive trace 410 may be coated, deposited, plated, or formed on a surface of the dielectric component 406 that faces the substrate 402) and may comprise a metal, such as Cu, Ni, and/or Au, among other examples. In some implementations, the housing 404 may include one or more optical elements, such as a DOE 414 (e.g., a diffuser), and/or a conductive path 416 associated with the one or more optical elements (e.g., to facilitate detection of damage to the one or more optical elements, as described above). The conductive path 416 may comprise, for example, ITO.

In some implementations, an integrated circuit 418 (e.g., a driving circuit), a VCSEL array 420 (e.g., comprising one or more VCSELs), and/or a photodiode 422 may be disposed on a surface of the substrate 402 (e.g., a top surface of the substrate 402 as shown in FIG. 4). In some implementations, the VCSEL array 420 may include one or more collimating lenses integrated with and/or bonded to the VCSEL array 420. The integrated circuit 418 may provide a driving current to allow the VCSEL array 420 to produce light (e.g., shown as collimated light due to the presence of the collimating lenses integrated with and/or bonded to the VCSEL array 420) that emits from the housing 404 via the one or more optical elements (e.g., via the DOE 414). The photodiode 422 may collect light reflected by the one or more optical elements to facilitate determining whether the one or more optical elements are damaged (e.g., as described above).

As further shown in FIG. 4, a connecting material 424 may be configured to physically (e.g., structurally) connect the conductive path 416 and/or the one or more optical elements (e.g., the DOE 414) to a conductive trace 410, of the one or more conductive traces 410 (e.g., a surface of the conductive trace 410 that contacts the one or more optical elements and/or the connecting material 424). Additionally, or alternatively, the connecting material 424 may be configured to electrically connect the conductive path 416 to the conductive trace 410. For example, the connecting material 424 may include a conductive epoxy (e.g., that comprises Ag). In some implementations, a portion of the conductive trace 410 and a portion of the conductive path 416 may contact the connecting material 424.

As further shown in FIG. 4, a connecting material 426 may be configured to physically (e.g., structurally) connect the conductive trace 410 to the substrate 402. Additionally, or alternatively, the connecting material 426 may be configured to electrically connect the conductive trace 410 to the substrate 402. For example, the connecting material 426 may include a conductive epoxy (e.g., that comprises Ag). In some implementations, an additional portion of the conductive trace 410 and a portion of the substrate 402 may contact the connecting material 426. Accordingly, the conductive trace 410 may be configured to provide an electrical connection between the substrate 402 and the conductive path 416 (e.g., via the connecting material 424 and the connecting material 426).

As further shown in FIG. 4, a connecting material 428 may be configured to physically (e.g., structurally) connect the EMI shield 408 (e.g., that is disposed on the dielectric component 406) to a substrate 430 of a user device (e.g., a user device, such a smart phone, that includes the package 400). Additionally, or alternatively, the connecting material 428 may be configured to electrically connect the EMI shield 408 to the substrate 430 of the user device. For example, the connecting material 428 may include a high-conductivity solder (e.g., a solder paste). In some implementations, a portion of the EMI shield 408 (e.g., a surface of the EMI shield 408 that contacts the connecting material 428) may be configured to bond with the connecting material 428 and/or the substrate 430 of the user device. For example, the portion of the EMI shield 408 may be plated with a metal, such as Cu, Ni, and/or Au.

As further shown in FIG. 4, a connecting material 432 (e.g., shown as a plurality of solder balls) may be configured to physically (e.g., structurally) connect the substrate 402 to the substrate 430 of the user device.

In some implementations, a method to form the housing 404 may include forming the dielectric component 406, the EMI shield 408, and/or the one or more conductive traces 410 in a similar manner as that described herein in relation to FIGS. 3A-3B and the dielectric component 306, the EMI shield 308, and/or the one or more conductive traces 310. The method may further include affixing the one or more optical elements (e.g., that include the DOE 414) and/or the conductive path 416 to the dielectric component 406 and/or the one or more conductive traces 410 (e.g., using the connecting material 424).

In some implementations, a method for assembling the package 400 may include affixing the housing 404 to the substrate 402 by connecting the one or more conductive traces 410 to the substrate 402 (e.g., using the connecting material 426). The method may include affixing the housing 404 to the substrate 430 of the user device by connecting the dielectric component 406 and/or the EMI shield 408 to the substrate 430 of the user device (e.g., using the connecting material 428). In some implementations, the method may include affixing the housing 404 to the substrate 402 and/or the substrate 430 of the user device using a passive alignment technique (e.g., where the one or more optical elements of the housing 404 are aligned over the VCSEL array 420 without monitoring light that emits from the package 400 via the VCSEL array 420 and the one or more optical elements) and/or an active alignment technique (e.g., where the one or more optical elements of the housing 404 are aligned over the VCSEL array 420 while monitoring an optical power, a diffraction pattern, and/or the like of the light that emits from the package 400 via the VCSEL array 420 and the one or more optical elements). The method may include attaching the substrate 402 to the substrate 430 of the user device by affixing the substrate 402 to the substrate 430 of the user device (e.g., using the connecting material 432).

As indicated above, FIG. 4 is provided as an example. Other examples may differ from what is described with regard to FIG. 4.

Figure 5A:
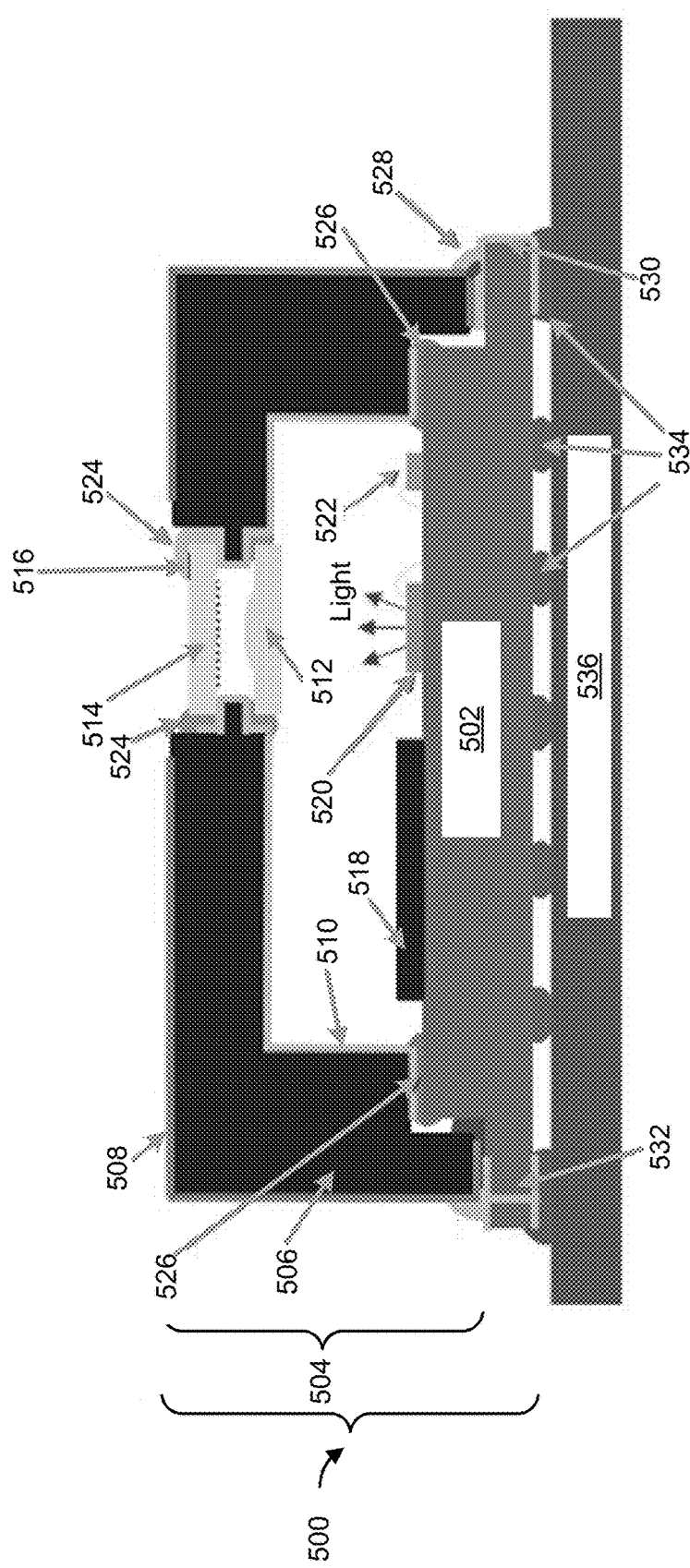
FIGS. 5A-5B are diagrams of an example package for an electro-optical device described herein.
Figure 5B:
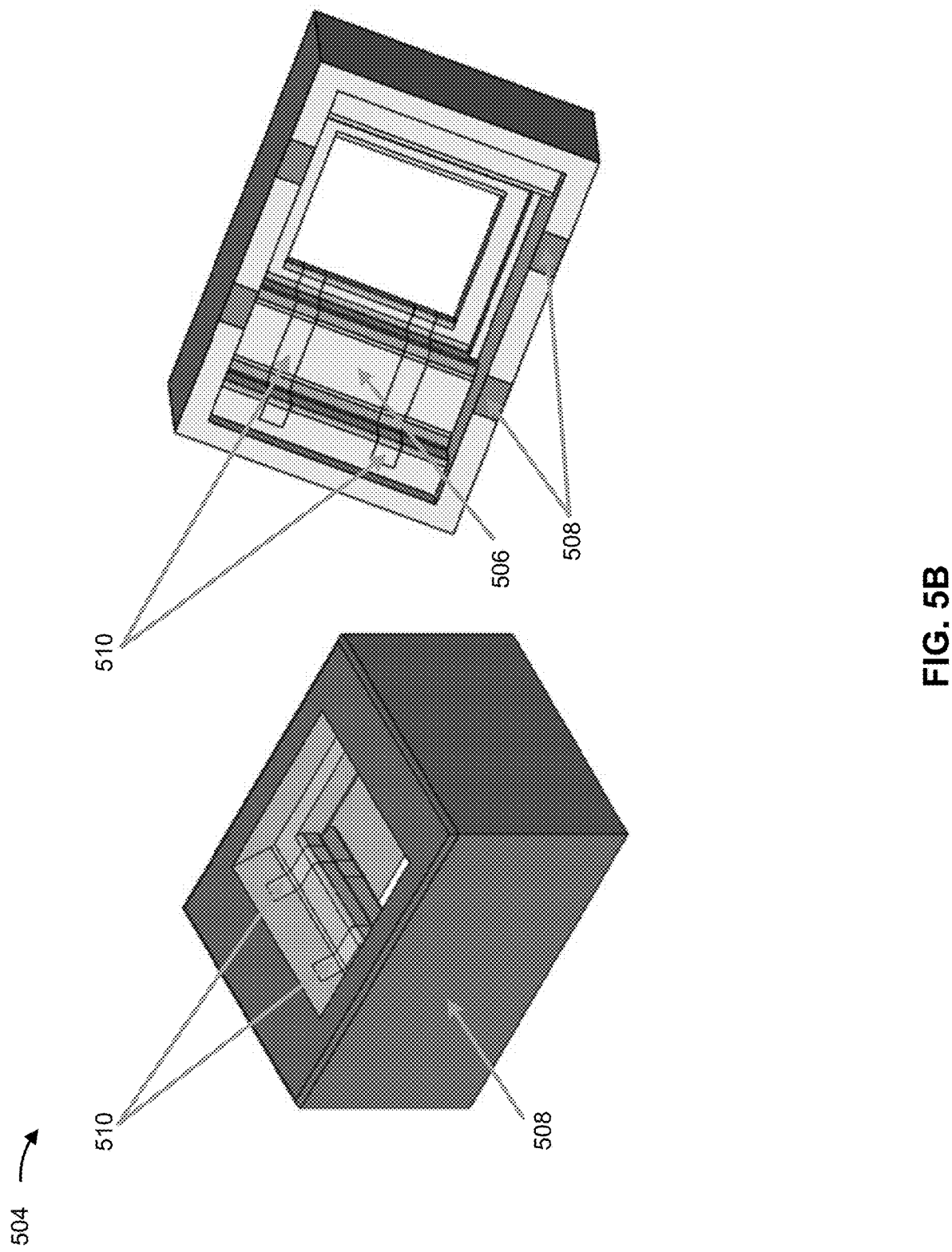

FIGS. 5A-5B are diagrams of an example package 500 for an electro-optical device, such as a ToF device. FIG. 5A illustrates a side cut-away view of the package 500. As shown in FIG. 5A, the package 500 includes a substrate 502 (e.g., a printed circuit board) and a housing 504 (e.g., a package housing). The housing 504 may include a dielectric component 506, an EMI shield 508, and/or one or more conductive traces 510 (e.g., one or more LDS traces).

The dielectric component 506 may comprise a molded dielectric polymer (e.g., that forms a molded dielectric structural component). As shown in FIG. 5A, the EMI shield 508 may be disposed on an exterior surface of the dielectric component 506 (e.g., the EMI shield 508 may be coated, deposited, plated, or formed on a surface of the dielectric component 506 that does not face the substrate 502). The EMI shield 508 may comprise a metal, such as Cu, Ni, and/or Au, among other examples. As further shown in FIG. 5A, a conductive trace 510, of the one or more conductive traces 510, may be disposed on an interior surface of the dielectric component 506 (e.g., the conductive trace 510 may be coated, deposited, plated, or formed on a surface of the dielectric component 506 that faces the substrate 502) and may comprise a metal, such as Cu, Ni, and/or Au, among other examples. In some implementations, the housing 504 may include one or more optical elements, such as a lens 512 (e.g., a collimating lens) and/or a DOE 514 (e.g., a diffuser), and/or a conductive path 516 associated with the one or more optical elements (e.g., to facilitate detection of damage to the one or more optical elements, as described above). The conductive path 516 may comprise, for example, ITO.

In some implementations, an integrated circuit 518 (e.g., a driving circuit), a VCSEL array 520 (e.g., comprising one or more VCSELs), and/or a photodiode 522 may be disposed on a surface of the substrate 502 (e.g., a top surface of the substrate 502 as shown in FIG. 5A). The integrated circuit 518 may provide a driving current to allow the VCSEL array 520 to produce light that emits from the housing 504 via the one or more optical elements (e.g., via the lens 512 and/or the DOE 514). The photodiode 522 may collect light reflected by the one or more optical elements to facilitate determining whether the one or more optical elements are damaged (e.g., as described above).

As further shown in FIG. 5A, a connecting material 524 may be configured to physically (e.g., structurally) connect the conductive path 516 and/or the one or more optical elements (e.g., the DOE 514) to a conductive trace 510, of the one or more conductive traces 510 (e.g., a surface of the conductive trace 510 that contacts the one or more optical elements and/or the connecting material 524). Additionally, or alternatively, the connecting material 524 may be configured to electrically connect the conductive path 516 to the conductive trace 510. For example, the connecting material 524 may include a conductive epoxy (e.g., that comprises Ag). In some implementations, a portion of the conductive trace 510 and a portion of the conductive path 516 may contact the connecting material 524.

As further shown in FIG. 5A, a connecting material 526 may be configured to physically (e.g., structurally) connect the conductive trace 510 to the substrate 502. Additionally, or alternatively, the connecting material 526 may be configured to electrically connect the conductive trace 510 to the substrate 502. For example, the connecting material 526 may include a conductive epoxy (e.g., that comprises Ag). Accordingly, the conductive trace 510 may be configured to provide an electrical connection between the substrate 502 and the conductive path 516 (e.g., via the connecting material 524 and the connecting material 526).

As further shown in FIG. 5A, a connecting material 528 may be configured to physically (e.g., structurally) connect the EMI shield 508 (e.g., that is disposed on the dielectric component 506) to the substrate 502. Additionally, or alternatively, the connecting material 528 may be configured to electrically connect the EMI shield 508 to the substrate 502. For example, the connecting material 528 may include a high-viscosity and/or high-conductivity solder (e.g., solder paste) and/or a conductive epoxy (e.g., that comprises Ag). In some implementations, a portion of the EMI shield 508 (e.g., a surface of the EMI shield 508 that contacts the connecting material 528) may be configured to bond with the connecting material 528 and/or the substrate 502. For example, the portion of the EMI shield 508 may be plated with a metal, such as Cu, Ni, and/or Au.

In some implementations, the portion of the EMI shield 508 and a portion of the substrate 502 (e.g., shown in FIG. 5A as a "step" cut-out of the substrate 502) may contact the connecting material 528. The portion of the substrate 502 may include metal plating 530 (e.g., that comprises Cu, Ni, and/or Au). Alternatively, an additional conductive trace 532 (e.g., that has a same or similar composition of the conductive trace 510) may be disposed on the portion of the substrate 502 (e.g., the additional conductive trace 532 may be coated, deposited, plated, or formed on the portion of the substrate 502).

As further shown in FIG. 5A, a connecting material 534 may be configured to physically (e.g., structurally) connect the substrate 502 to a substrate 536 of a user device (e.g., a user device, such a smart phone, that includes the package 500). Additionally, or alternatively, the connecting material 534 may be configured to electrically connect the substrate 502 to the substrate 536 of the user device. For example, the connecting material 534 may include a high-conductivity solder (e.g., a solder paste). In some implementations, the portion of the substrate 502 that includes the metal plating 530 and/or the additional conductive trace 532 may contact the connecting material 534 and/or the substrate 536 of the user device.

As shown in FIG. 5B, which shows a top 3D view and a bottom 3D view of the housing 504, the EMI shield 508 (e.g., that is disposed on an exterior surface of the dielectric component 506) may cover a top surface and multiple side surfaces of the housing 504, and portions of the EMI shield 508 may extend to a bottom surface of the housing 504 (e.g., to bond with the connecting material 528 and/or a portion of the substrate 502, as described in relation to FIG. 5A). As further shown in FIG. 5B, a plurality of conductive traces 510 are disposed on an interior surface of the dielectric component 506 (e.g., to bond with the connecting material 524 and/or the conductive path 516 and/or to bond with the connecting material 526 and/or the substrate 502).

In some implementations, a method for forming the housing 504 may include forming the dielectric component 506, the EMI shield 508, and/or the one or more conductive traces 510 in a similar manner as that described herein in relation to FIGS. 3A-3B and the dielectric component 306, the EMI shield 308, and/or the one or more conductive traces 310. The method may further include affixing the one or more optical elements (e.g., that include the lens 512 and the DOE 514) and/or the conductive path 516 to the dielectric component 506 and/or the one or more conductive traces 510 (e.g., using the connecting material 524).

In some implementations, a method for assembling the package 500 may include affixing the housing 504 to the substrate 502 by connecting the one or more conductive traces 510 to the substrate 502 (e.g., using the connecting material 526). The method may include affixing the housing 504 to the substrate 502 by connecting the dielectric component 506 and/or the EMI shield 508 to the substrate 502 of the user device (e.g., using the connecting material 528). In some implementations, the method may include affixing the housing 504 to the substrate 502 using a passive alignment technique (e.g., where the one or more optical elements of the housing 504 are aligned over the VCSEL array 520 without monitoring light that emits from the package 500 via the VCSEL array 520 and the one or more optical elements) and/or an active alignment technique (e.g., where the one or more optical elements of the housing 504 are aligned over the VCSEL array 520 while monitoring an optical power, a diffraction pattern, and/or the like of the light that emits from the package 500 via the VCSEL array 520 and the one or more optical elements). The method may include attaching the substrate 502 to the substrate 536 of the user device by affixing the substrate 502 to the substrate 536 of the user device (e.g., using the connecting material 534).

As indicated above, FIGS. 5A-5B are provided as an example. Other examples may differ from what is described with regard to FIGS. 5A-5B.

Figure 6A:
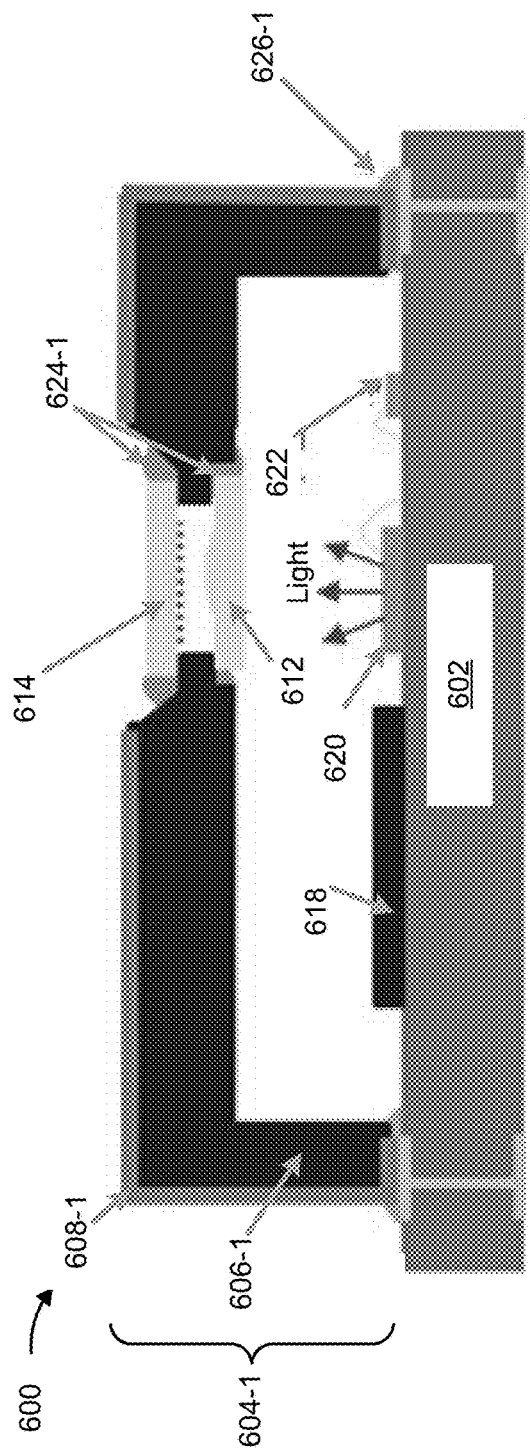
FIGS. 6A-6B are diagrams of an example package for an electro-optical device described herein.
Figure 6B:
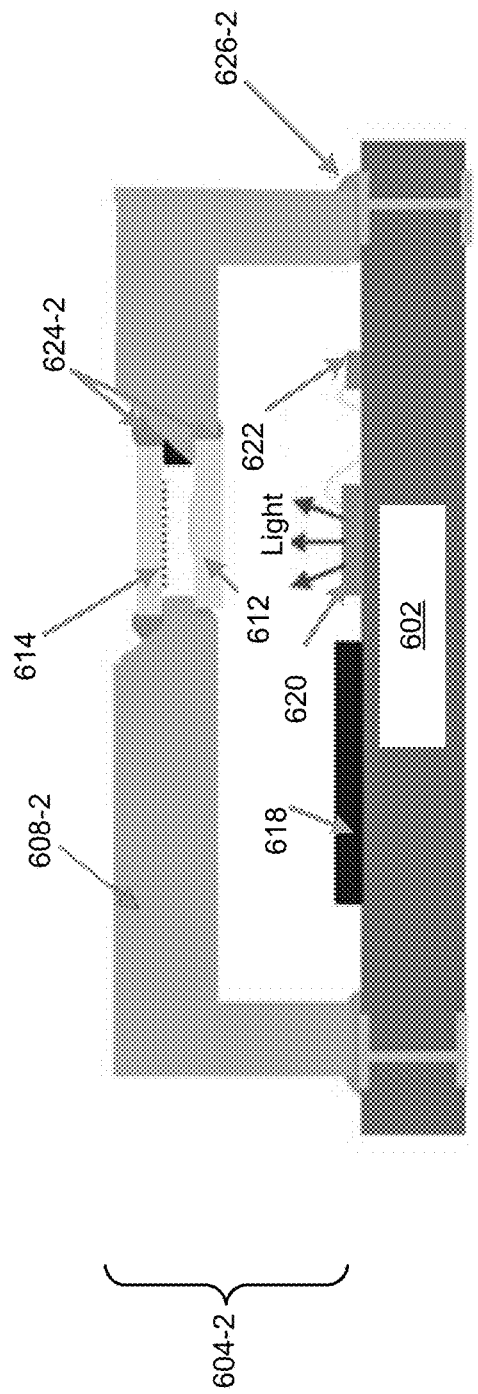

FIGS. 6A-6B are diagrams of an example package 600 for an electro-optical device, such as a ToF device. FIG. 6A illustrates a side cut-away view of a first configuration of the package 600. As shown in FIG. 6A, the package 600 includes a substrate 602 (e.g., a printed circuit board) and a housing 604-1 (e.g., a package housing). The housing 604-1 may include a dielectric component 606-1 and/or an EMI shield 608-1.

The dielectric component 606-1 may comprise a molded dielectric polymer (e.g., that forms a molded dielectric structural component). As shown in FIG. 6A, the EMI shield 608-1 may be disposed on an exterior surface of the dielectric component 606-1 (e.g., the EMI shield 608-1 may be coated, deposited, plated, or formed on a surface of the dielectric component 606-1 that does not face the substrate 602). The EMI shield 608-1 may comprise a metal, such as Cu, Ni, Au, and/or stainless steel, among other examples. In some implementations, the housing 604-1 may include one or more optical elements, such as a lens 612 (e.g., a collimating lens) and/or a DOE 614 (e.g., a diffuser).

In some implementations, an integrated circuit 618 (e.g., a driving circuit), a VCSEL array 620 (e.g., comprising one or more VCSELs), and/or a photodiode 622 may be disposed on a surface of the substrate 602 (e.g., a top surface of the substrate 602 as shown in FIG. 6A). The integrated circuit 618 may provide a driving current to allow the VCSEL array 620 to produce light that emits from the housing 604-1 via the one or more optical elements (e.g., via the lens 612 and/or the DOE 614). The photodiode 622 may collect light reflected by the one or more optical elements to facilitate determining whether the one or more optical elements are damaged (e.g., as described above).

As further shown in FIG. 6A, a connecting material 624-1 may be configured to physically (e.g., structurally) connect the one or more optical elements (e.g., the lens 612 and/or the DOE 614) to the dielectric component 606-1. For example, the connecting material 624-1 may include a conductive epoxy (e.g., a UV-curable epoxy that comprises Ag). As further shown in FIG. 6A, a connecting material 626-1 may be configured to physically (e.g., structurally) connect the EMI shield 608-1 (e.g., that is disposed on the dielectric component 606-1) to the substrate 602. Additionally, or alternatively, the connecting material 626-1 may be configured to electrically connect the EMI shield 608-1 to the substrate 602. For example, the connecting material 626-1 may include a high-conductivity solder (e.g., solder paste) and/a conductive epoxy (e.g., a UV-curable epoxy that comprises Ag). In some implementations, a portion of the EMI shield 608-1 (e.g., a surface of the EMI shield 608-1 that contacts the connecting material 626-1) may be configured to bond with the connecting material 626-1 and/or the substrate 602. For example, the portion of the EMI shield 608-1 may be plated with a metal, such as Cu, Ni, and/or Au.

In some implementations, a method to form the housing 604-1 may include forming the dielectric component 606-1 and the EMI shield 608-1 in a similar manner as that described herein in relation to FIGS. 3A-3B and the dielectric component 306 and the EMI shield 308. The method may further include affixing the one or more optical elements (e.g., that include the lens 612 and the DOE 614) to the dielectric component 606 (e.g., using the connecting material 624-1).

In some implementations, a method for assembling the first configuration of the package 600, as shown in FIG. 6A, may include affixing the housing 604-1 to the substrate 602 by connecting the dielectric component 606-1 and/or the EMI shield 608-1 to the substrate 602 (e.g., using the connecting material 626-1). The method may include affixing the housing 604-1 to the substrate 602 using a passive alignment technique (e.g., where the one or more optical elements of the housing 604-1 are aligned over the VCSEL array 620 without monitoring light that emits from the package 600 via the VCSEL array 620 and the one or more optical elements) and/or an active alignment technique (e.g., where the one or more optical elements of the housing 604-1 are aligned over the VCSEL array 620 while monitoring an optical power, a diffraction pattern, and/or the like of the light that emits from the package 600 via the VCSEL array 620 and the one or more optical elements).

FIG. 6B illustrates a side cut-away view of a second configuration of the package 600. As shown in FIG. 6B, the package 600 includes the substrate 602 and a housing 604-2 (e.g., a package housing). The housing 604-2 may include an EMI shield 608-2 that comprises a metal, such as zinc (Zn), magnesium (Mg), or aluminum (Al) (e.g., that is formed via metal injection molding (MIM), or die-casting). In some implementations, the housing 604-2 may include the one or more optical elements, such as the lens 612 and/or the DOE 614. In some implementations, the integrated circuit 618, the VCSEL array 620, and/or the photodiode 622 may be disposed on a surface of the substrate 602 (e.g., the top surface of the substrate 602 as shown in FIG. 6B).

As further shown in FIG. 6B, a connecting material 624-2 may be configured to physically (e.g., structurally) connect the one or more optical elements (e.g., the lens 612 and/or the DOE 614) to the EMI shield 608-2. For example, the connecting material 624-2 may include a conductive epoxy (e.g., a UV-curable epoxy that comprises Ag). As further shown in FIG. 6B, a connecting material 626-2 may be configured to physically (e.g., structurally) connect and/or electrically connect the EMI shield 608-2 to the substrate 602. For example, the connecting material 626-2 may include a high-conductivity solder (e.g., a solder paste) and/or a conductive epoxy (e.g., a UV-curable epoxy that comprises Ag). In some implementations, a portion of the EMI shield 608-2 (e.g., a surface of the EMI shield 608-2 that contacts the connecting material 626-2) may be configured to bond with the connecting material 626-2 and/or the substrate 602. For example, the portion of the EMI shield 608-2 may be plated with a metal, such as Cu, Ni, and/or Au.

In some implementations, a method for forming the housing 604-2 may include forming the EMI shield 608-2 using a MIM process. The method may further include affixing the one or more optical elements (e.g., that include the lens 612 and the DOE 614) to the EMI shield 608-2 (e.g., using the connecting material 624-2).

In some implementations, a method for assembling the second configuration of the package 600, as shown in FIG. 6B, may include affixing the housing 604-2 to the substrate 602 by connecting the EMI shield 608-2 to the substrate 602 (e.g., using the connecting material 626-2). The method may include affixing the housing 604-2 to the substrate 602 using a passive alignment technique (e.g., where the one or more optical elements of the housing 604-2 are aligned over the VCSEL array 620 without monitoring light that emits from the package 600 via the VCSEL array 620 and the one or more optical elements) and/or an active alignment technique (e.g., where the one or more optical elements of the housing 604-2 are aligned over the VCSEL array 620 while monitoring an optical power, a diffraction pattern, and/or the like of the light that emits from the package 600 via the VCSEL array 620 and the one or more optical elements).

As indicated above, FIGS. 6A-6B are provided as an example. Other examples may differ from what is described with regard to FIGS. 6A-6B.

Figure 7A:
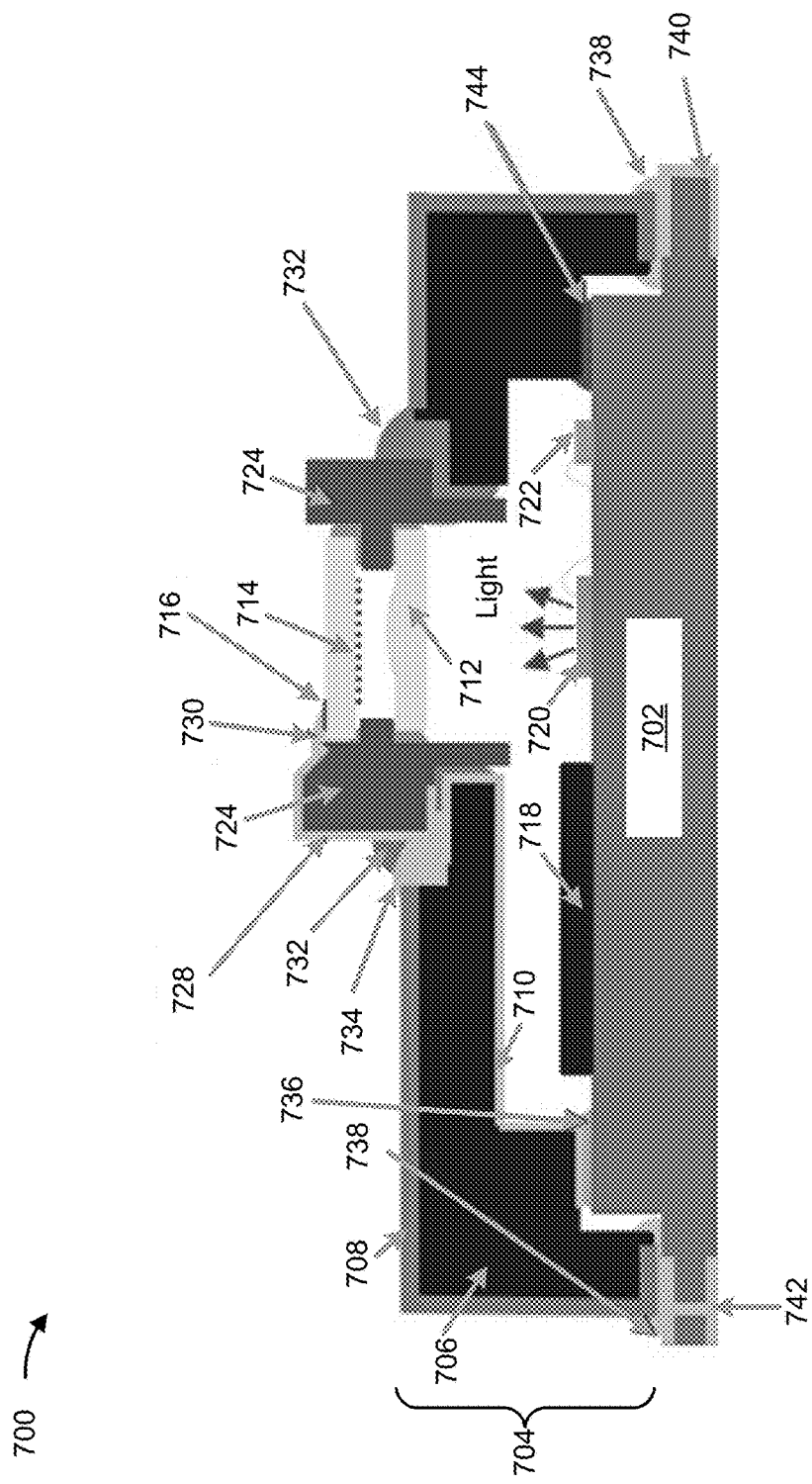
FIGS. 7A-7B are diagrams of an example package for an electro-optical device described herein.
Figure 7B:
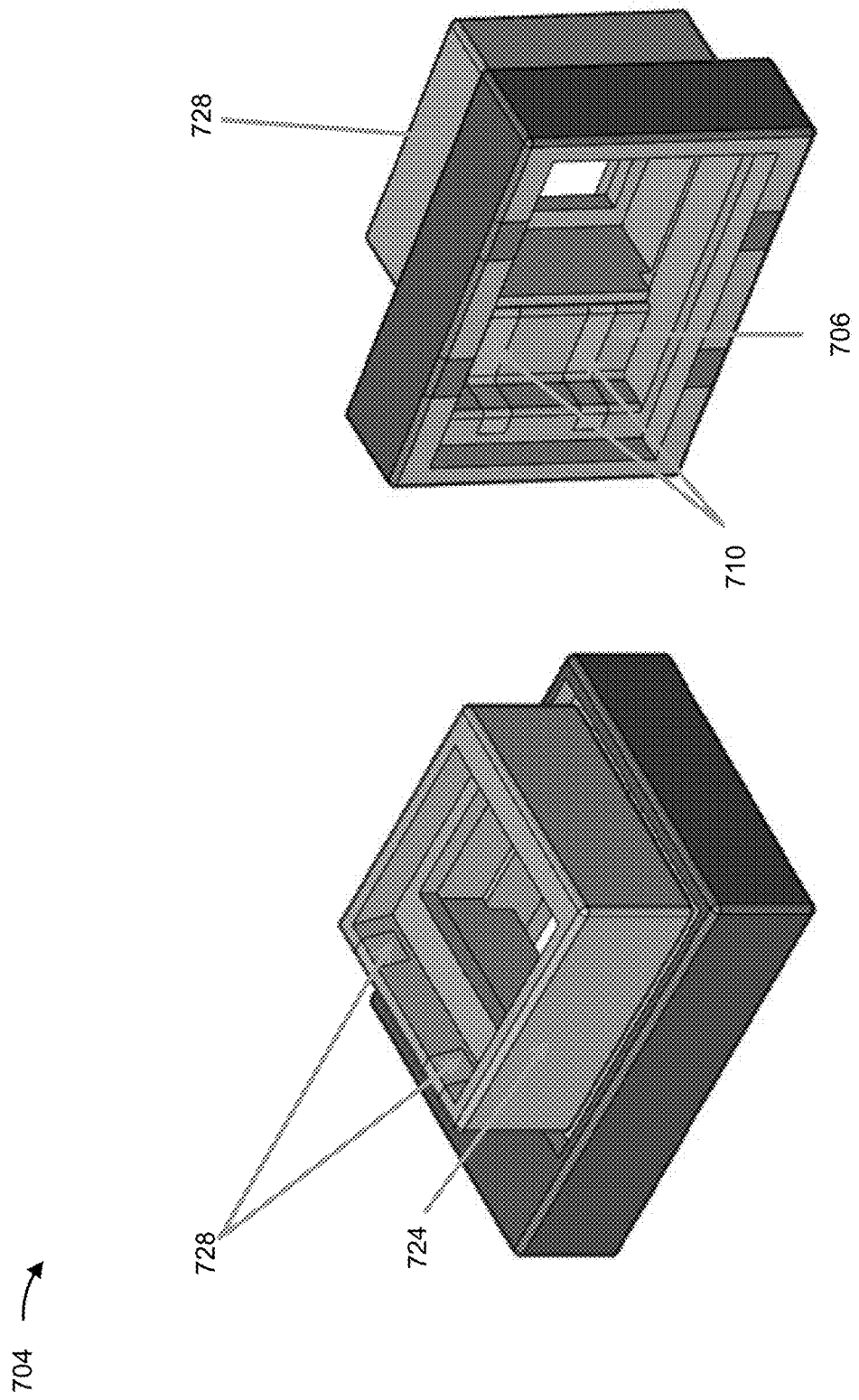

FIGS. 7A-7B are diagrams of an example package for an electro-optical device, such as a ToF device. FIG. 7A illustrates a side cut-away view of the package 700. As shown in FIG. 7A, the package 700 includes a substrate 702 (e.g., a printed circuit board) and a housing 704 (e.g., a package housing). The housing 704 may include a dielectric component 706, an EMI shield 708, and/or one or more conductive traces 710 (e.g., one or more LDS traces).

The dielectric component 706 may comprise a molded dielectric polymer (e.g., that forms a molded dielectric structural component). As shown in FIG. 7A, the EMI shield 708 may be disposed on an exterior surface of the dielectric component 706 (e.g., the EMI shield 708 may be coated, deposited, plated, or formed on a surface of the dielectric component 706 that does not face the substrate 702). The EMI shield 708 may comprise a metal, such as Cu, Ni, Au, and/or stainless steel, among other examples. As further shown in FIG. 7A, a conductive trace 710, of the one or more conductive traces 710, may be disposed on an interior surface of the dielectric component 706 (e.g., the conductive trace 710 may be coated, deposited, plated, or formed on a surface of the dielectric component 706 that faces the substrate 702). In some implementations, the housing 704 may include one or more optical elements, such as a lens 712 (e.g., a collimating lens) and/or a DOE 714 (e.g., a diffuser), and/or a conductive path 716 associated with the one or more optical elements (e.g., to facilitate detection of damage to the one or more optical elements, as described above). The conductive path 716 may comprise, for example, ITO.

In some implementations, an integrated circuit 718 (e.g., a driving circuit), a VCSEL array 720 (e.g., comprising one or more VCSELs), and/or a photodiode 722 may be disposed on a surface of the substrate 702 (e.g., a top surface of the substrate 702 as shown in FIG. 7A). The integrated circuit 718 may provide a driving current to allow the VCSEL array 720 to produce light that emits from the housing 704 via the one or more optical elements (e.g., via the lens 712 and/or the DOE 714). The photodiode 722 may collect light reflected by the one or more optical elements to facilitate determining whether the one or more optical elements are damaged (e.g., as described above).

As further shown in FIG. 7A, an optics assembly 724 may hold the one or more optical elements (e.g., the lens 712 and/or the DOE 714). The optics assembly 724 may comprise a molded dielectric polymer or a similar material for holding the one or more optical elements. As shown in FIG. 7A, the optics assembly 724 may be positioned over the substrate 702 (e.g., to allow the light produced by the VCSEL array 720 to emit via the one or more optical elements) in an opening of the housing 704 (e.g., formed by an opening of the dielectric component 706 and/or the EMI shield 708). In some implementations, an additional conductive trace 728 may be disposed on an exterior surface of the optics assembly 724 (e.g., the additional conductive trace 728 may be coated, deposited, plated, or formed on a surface of the optics assembly 724 that does not face the substrate 702).

As further shown in FIG. 7A, a connecting material 730 may be configured to physically (e.g., structurally) connect the conductive path 716 and/or the one or more optical elements (e.g., the DOE 714) to the optics assembly 724 and/or the additional conductive trace 728. Additionally, or alternatively, the connecting material 730 may be configured to electrically connect the conductive path 716 to the additional conductive trace 728. For example, the connecting material 730 may include a conductive epoxy (e.g., a UV-curable epoxy that comprises Ag). In some implementations, a portion of the additional conductive trace 728 and a portion of the conductive path 716 may contact the connecting material 730.

As further shown in FIG. 7A, a connecting material 732 may be configured to physically (e.g., structurally) connect the optics assembly 724 to the rest of the housing 704 (e.g., the dielectric component 706, the EMI shield 708, and/or the conductive trace 710) in the opening of the housing 704. For example, the connecting material 732 may include conductive epoxy (e.g., a UV-curable epoxy that comprises Ag). As shown in FIG. 7A, the connecting material 732 may connect the optics assembly 724 and/or the additional conductive trace 728 (e.g., that is formed on the optics assembly 724) to the dielectric component 706 and/or the conductive trace 710 (e.g., that is formed on the dielectric component 706).

As further shown in FIG. 7A, a connecting material 734 may be configured to electrically connect the conductive trace 710 to the additional conductive trace 728 (e.g., that is formed on the optics assembly 724). For example, the connecting material 734 may include a conductive epoxy (e.g., that comprises Ag). As further shown in FIG. 7A, a connecting material 736 may be configured to electrically connect the conductive trace 710 to the substrate 702. For example, the connecting material 736 may include a conductive epoxy (e.g., that comprises Ag). Accordingly, the conductive trace 710 may be configured to provide an electrical connection between the substrate 702 and the additional conductive trace 728 (e.g., via the connecting material 734 and the connecting material 736) and thereby provide an electrical connection between the substrate 702 and the conductive path 716 (e.g., via the additional conductive trace 728 and the connecting material 730).

As further shown in FIG. 7A, a connecting material 738 may be configured to electrically connect the EMI shield 708 to the substrate 702. In some implementations, a portion of the EMI shield 708 (e.g., a surface of the EMI shield 708 that contacts the connecting material 738) may be configured to bond with the connecting material 738 and/or the substrate 702. For example, the portion of the EMI shield 708 may be plated with a metal, such as Cu, Ni, and/or Au.

In some implementations, the portion of the EMI shield 708 may be configured to bond with the connecting material 738 and/or a portion of the substrate 702 (e.g., shown in FIG. 7A as a "step" cut-out of the substrate 702). The portion of the substrate 702 may include metal plating 740 (e.g., plated with Cu, Ni, and/or Au). Alternatively, another conductive trace 742 (e.g., that has a same or similar composition of the conductive trace 710) may be disposed through a portion of the substrate 702 (e.g., the other conductive trace 742 may be coated or plated on the portion of the substrate 702).

As further shown in FIG. 7A, a connecting material 744 may be configured to physically (e.g., structurally) connect the substrate 702 to the dielectric component 706. For example, the connecting material 744 may include a high-viscosity solder (e.g., a solder paste).

As shown in FIG. 7B, which shows a top 3D view and a bottom 3D view of the housing 704, the optics assembly 724 is positioned in an opening of the housing 704. As further shown in FIG. 7B, a plurality of conductive traces 710 are disposed on an interior surface of the dielectric component 706 and a plurality of additional conductive traces 728 are disposed on an exterior surface of the optics assembly 724 (e.g., as described herein in relation to FIG. 7A).

In some implementations, a method to form the housing 704 may include forming the dielectric component 706, the EMI shield 708, and/or the one or more conductive traces 710 in a similar manner as that described herein in relation to FIGS. 3A-3B and the dielectric component 306, the EMI shield 308, and/or the one or more conductive traces 310. Furthermore, in some implementations, a method for forming the optics assembly 724 may include using an injection molding process (e.g., that includes an LCP injection molding process or other polymer injection molding process) to form the optics assembly 724 (e.g., that comprises a molded dielectric polymer). The method may further include affixing the one or more optical elements (e.g., that include the lens 712 and the DOE 714) and/or the conductive path 716 to the optics assembly 724 and/or the additional conductive trace 728 (e.g., using the connecting material 730).

In some implementations, a method for assembling the package 700 may include affixing the housing 704 to the substrate 702 by connecting the one or more conductive traces 710 to the substrate 702 (e.g., using the connecting material 736). The method may include affixing the housing 704 to the substrate 702 of the user device by connecting the dielectric component 706 and/or the EMI shield 708 to the substrate 702 (e.g., using the connecting material 738 and/or the connecting material 744). The method may further include affixing the optics assembly 724 and/or the additional conductive trace 728 to the dielectric component 706 and/or the one or more conductive traces 710 (e.g., using the connecting material 732 and the connecting material 734). In some implementations, the method may include affixing the optics assembly 724 and/or the additional conductive trace 728 to the dielectric component 706 and/or the one or more conductive traces 710 using a passive alignment technique (e.g., where the one or more optical elements of the optics assembly 724 are aligned over the VCSEL array 720 without monitoring light that emits from the package 700 via the VCSEL array 720 and the one or more optical elements) and/or an active alignment technique (e.g., where the one or more optical elements of the optics assembly 724 are aligned over the VCSEL array 720 while monitoring an optical power, a diffraction pattern, and/or the like of the light that emits from the package 700 via the VCSEL array 720 and the one or more optical elements).

As indicated above, FIGS. 7A-7B are provided as an example. Other examples may differ from what is described with regard to FIGS. 7A-7B.

Figure 8:
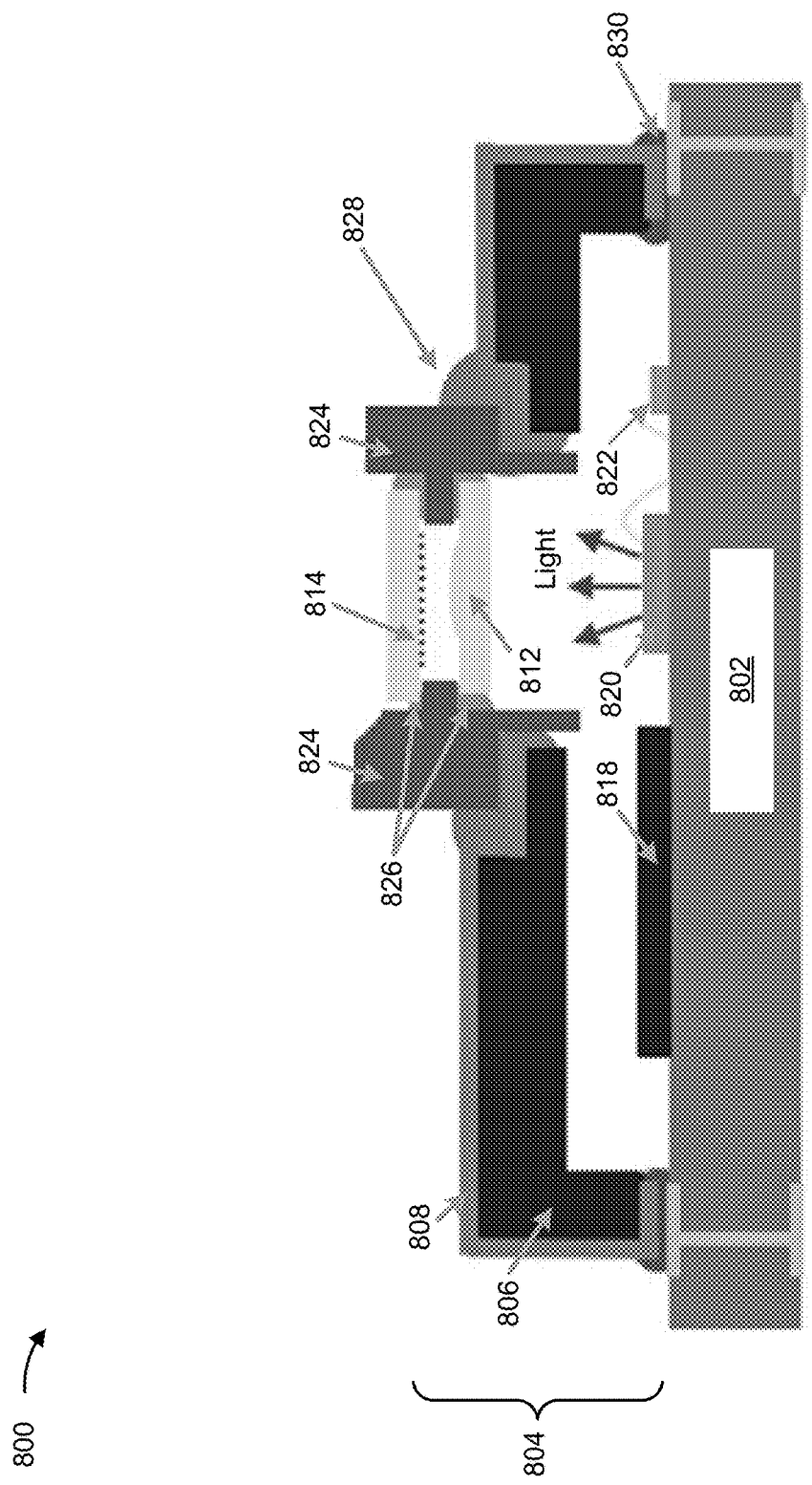
FIG. 8 is a diagram of an example package 800 for an electro-optical device described herein.

FIG. 8 is a diagram of an example package 800 for an electro-optical device, such as a ToF device. FIG. 8 illustrates a side cut-away view of the package 800. As shown in FIG. 8, the package 800 includes a substrate 802 (e.g., a printed circuit board) and a housing 804 (e.g., a package housing). The housing 804 may include a dielectric component 806 and/or an EMI shield 808. The dielectric component 806 may comprise a molded dielectric polymer (e.g., that forms a molded dielectric structural component). As shown in FIG. 8, the EMI shield 808 may be disposed on an exterior surface of the dielectric component 806 (e.g., the EMI shield 808 may be coated, deposited, plated, or formed on a surface of the dielectric component 806 that does not face the substrate 802). The EMI shield 808 may comprise a metal, such as Cu, Ni, Au, and/or stainless steel, among other examples. In some implementations, the housing 804 may include one or more optical elements, such as a lens 812 (e.g., a collimating lens) and/or a DOE 814 (e.g., a diffuser).

In some implementations, an integrated circuit 818 (e.g., a driving circuit), a VCSEL array 820 (e.g., comprising one or more VCSELs), and/or a photodiode 822 may be disposed on a surface of the substrate 802 (e.g., a top surface of the substrate 802 as shown in FIG. 8). The integrated circuit 818 may provide a driving current to allow the VCSEL array 820 to produce light that emits from the housing 804 via the one or more optical elements (e.g., via the lens 812 and/or the DOE 814). The photodiode 822 may collect light reflected by the one or more optical elements to facilitate determining whether the one or more optical elements are damaged (e.g., as described above).

As further shown in FIG. 8, an optics assembly 824 may hold the one or more optical elements (e.g., the lens 812 and/or the DOE 814). The optics assembly 824 may comprise a molded dielectric polymer or a similar material for holding the one or more optical elements. As shown in FIG. 8, the optics assembly 824 may be positioned over the substrate 802 (e.g., to allow the light produced by the VCSEL array 820 to emit via the one or more optical elements) in an opening of the housing 804 (e.g., formed by an opening of the dielectric component 806 and/or the EMI shield 808).

As further shown in FIG. 8, a connecting material 826 may be configured to physically (e.g., structurally) connect the one or more optical elements (e.g., the lens 812 and/or the DOE 814) to the optics assembly 824. For example, the connecting material 826 may include a conductive epoxy (e.g., that comprises Ag).

As further shown in FIG. 8, a connecting material 828 may be configured to physically (e.g., structurally) connect the optics assembly 824 to the rest of the housing 804 (e.g., the dielectric component 806 and/or the EMI shield 808) in the opening of the housing 804. For example, the connecting material 828 may include a conductive epoxy (e.g., a UV-curable epoxy that comprises Ag). As shown in FIG. 8, the connecting material 828 may connect the optics assembly 824 to the dielectric component 806 and/or the EMI shield 808.

As further shown in FIG. 8, a connecting material 830 may be configured to physically (e.g., structurally) connect the EMI shield 808 (e.g., that is disposed on the dielectric component 806) to the substrate 802. Additionally, or alternatively, the connecting material 830 may be configured to electrically connect the EMI shield 808 to the substrate 802. For example, the connecting material 830 may include a high-conductivity solder (e.g., solder paste) and/or a conductive epoxy (e.g., a UV-curable epoxy that comprises Ag. In some implementations, a portion of the EMI shield 808 (e.g., a surface of the EMI shield 808 that contacts the connecting material 830) may be configured to bond with the connecting material 830 and/or the substrate 802. For example, the portion of the EMI shield 808 may be plated with a metal, such as Cu, Ni, and/or Au.

In some implementations, a method to form the housing 804 may include forming the dielectric component 806 and the EMI shield 808 in a similar manner as that described herein in relation to FIGS. 3A-3B and the dielectric component 306 and the EMI shield 308. Furthermore, in some implementations, a method for forming the optics assembly 824 may include using an injection molding process (e.g., that includes an LCP injection molding process or other polymer injection molding process) to form the optics assembly 824 (e.g., that comprises a molded dielectric polymer). The method may further include affixing the one or more optical elements (e.g., that include the lens 812 and the DOE 814) to the optics assembly 824 (e.g., using the connecting material 826).

In some implementations, a method for assembling the package 800 may include affixing the housing 804 to the substrate 802 by connecting the dielectric component 806 and/or the EMI shield 808 to the substrate 802 (e.g., using the connecting material 830). The method may further include affixing the optics assembly 824 to the dielectric component 806 and/or the EMI shield 808 (e.g., using the connecting material 828). In some implementations, the method may include affixing the optics assembly 824 to the dielectric component 806 and/or the EMI shield 808 using a passive alignment technique (e.g., where the one or more optical elements of the optics assembly 824 are aligned over the VCSEL array 820 without monitoring light that emits from the package 800 via the VCSEL array 820 and the one or more optical elements) and/or an active alignment technique (e.g., where the one or more optical elements of the optics assembly 824 are aligned over the VCSEL array 820 while monitoring an optical power, a diffraction pattern, and/or the like of the light that emits from the package 800 via the VCSEL array 820 and the one or more optical elements).

As indicated above, FIG. 8 is provided as an example. Other examples may differ from what is described with regard to FIG. 8.

Figure 9:
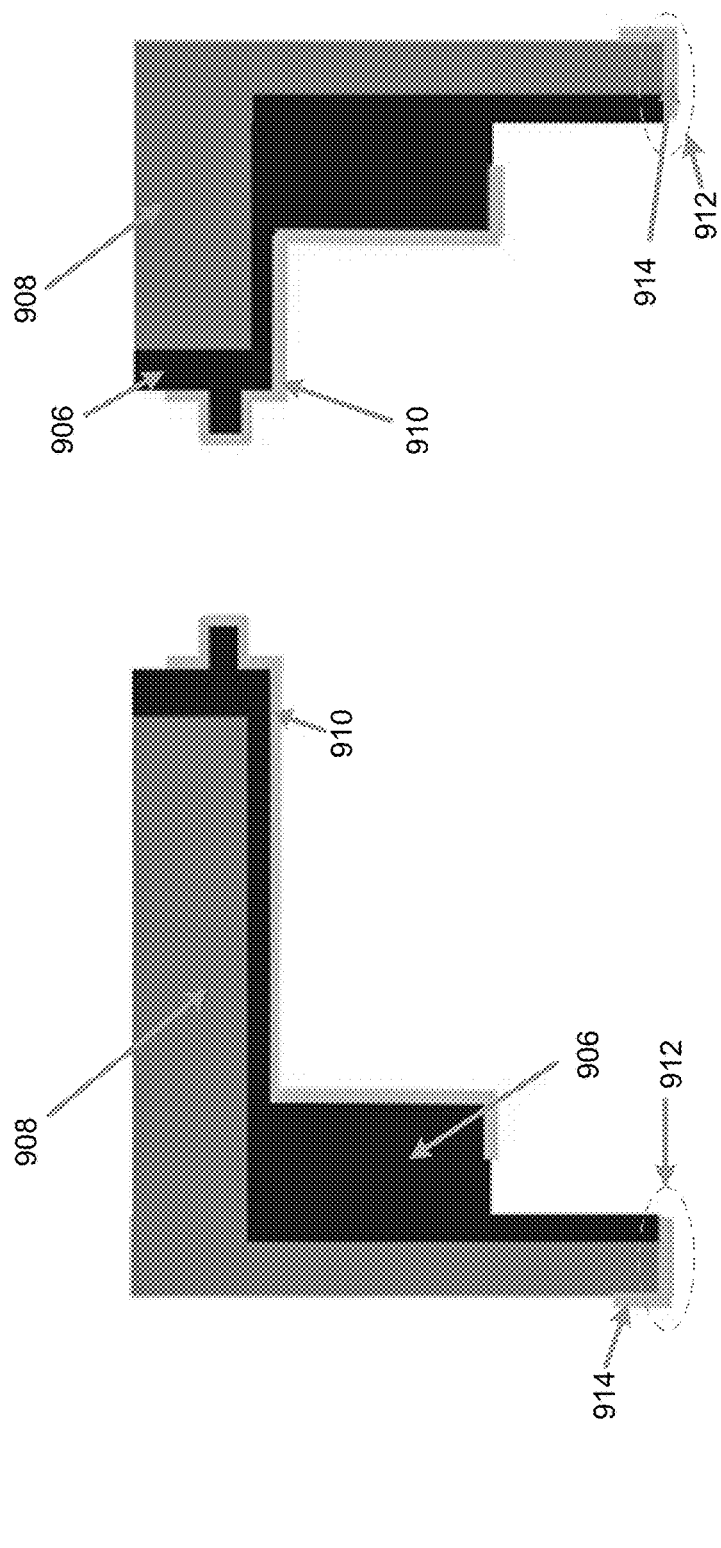
FIG. 9 is a diagram showing a side cut-away view of an example housing for a package of an electro-optical device described herein.

FIG. 9 is a diagram showing a side cut-away view of an example housing 900 for a package of an electro-optical device, such as a ToF device. As shown in FIG. 9, the housing 900 may include a dielectric component 906, an EMI shield 908, and/or one or more conductive traces 910 (e.g., one or more LDS traces). The dielectric component 906 may comprise a molded dielectric polymer (e.g., that forms a molded dielectric structural component). As shown in FIG. 9, the EMI shield 908 may comprise a molded conductive polymer or a MIM material that is disposed on an exterior surface of the dielectric component 906. The EMI shield 908 may comprise a metal, such as Cu, Ni, Au, and/or stainless steel, among other examples. As further shown in FIG. 9, a conductive trace 910, of the one or more conductive traces 910, may be disposed on an interior surface of the dielectric component 906 (e.g., the conductive trace 910 may be coated, deposited, plated, or formed on the interior surface of the dielectric component 906).

As further shown in FIG. 9, one or more conductive traces 914, comprised of the same material, or a similar material, as the one or more conductive traces 910, may be disposed on one or more bottom portions 912 of the dielectric component 906 and/or the EMI shield 908. Accordingly, the one or more conductive traces 914 (e.g., that are associated with the one or more bottom portions 912 of the dielectric component 906 and/or the EMI shield 908) may contact a substrate (not shown in FIG. 9) associated with the housing 900 (e.g., when the housing 900 is assembled as part of a package).

In some implementations, the method for forming the housing 900 may include using an injection molding process (e.g., that includes an LCP injection molding process or other polymer injection molding process) to form the EMI shield 908 (e.g., that comprises a molded conductive polymer). The method may further include using the injection molding process to form the dielectric component 906 (e.g., that comprises a molded dielectric polymer) on the EMI shield 908 (e.g., such that the EMI shield 908 is disposed on an external surface of the dielectric component 906 after the dielectric component 906 is formed) and a coating process to form the one or more conductive traces 910 (e.g., on an interior surface of the dielectric component 906). Alternatively, the method may further include using a coating process to form the dielectric component 906 (e.g., that comprises a dielectric film) on the EMI shield 908 (e.g., such that the EMI shield 908 is disposed on an external surface of the dielectric component 906 after the dielectric component 906 is formed) and a coating process to form the one or more conductive traces 910 (e.g., on an interior surface of the dielectric component 906). The method may include using the same coating process to form the one or more conductive traces 914 (e.g., on the one or more bottom portions 912 of the dielectric component 906 and/or the EMI shield 908) as the coating process to form the one or more conductive traces 910.

As indicated above, FIG. 9 is provided as an example. Other examples may differ from what is described with regard to FIG. 9.

The foregoing disclosure provides illustration and description, but is not intended to be exhaustive or to limit the implementations to the precise form disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A housing for an electro-optical device, comprising:
a molded dielectric structural component including:
   a top portion, and
   a first side portion that extends orthogonally from the top portion,
      wherein the first side portion includes a first distal end that is configured to be connected to a first end portion of a substrate associated with the electro-optical device, and
   a second side portion that is opposite the first side portion and extends orthogonally from the top portion,
      wherein the second side portion includes a second distal end that is configured to be connected to a second end portion of the substrate;
an electromagnetic interference (EMI) shield; and
a plurality of conductive traces,
   wherein the molded dielectric structural component is configured to separate the EMI shield and the plurality of conductive traces.

2. The housing of claim 1, wherein:
the EMI shield is disposed on an exterior surface of the molded dielectric structural component; and
at least one conductive trace, of the plurality of conductive traces, is disposed within the molded dielectric structural component,
   wherein the at least one conductive trace is electrically connected to the substrate and a conductive path associated with an optical element of the electro-optical device.

3. The housing of claim 1, wherein:
the EMI shield is disposed on an exterior surface of the molded dielectric structural component; and
at least one conductive trace, of the plurality of conductive traces, is disposed on an interior surface of the molded dielectric structural component,
   wherein the at least one conductive trace is electrically connected to the substrate and a conductive path associated with an optical element of the electro-optical device.

4. The housing of claim 3, wherein a portion of the at least one conductive trace contacts a connecting material that electrically connects the at least one conductive trace to the substrate.

5. The housing of claim 3, wherein:
a portion of the EMI shield contacts a first connecting material that electrically connects the EMI shield to the first end portion of the substrate; and
a portion of the at least one conductive trace contacts a second connecting material that electrically connects the at least one conductive trace to the second end portion of the substrate.

6. The housing of claim 1, wherein:
the EMI shield is disposed on an exterior surface of the molded dielectric structural component; and
at least one conductive trace, of the plurality of conductive traces, is disposed on an interior surface of the molded dielectric structural component,
   wherein the at least one conductive trace is electrically connected to the substrate and an optics assembly of the electro-optical device, and
      wherein the optics assembly is positioned over the substrate in an opening of the molded dielectric structural component, and
      wherein the opening is formed by the first side portion and the second side portion of the molded dielectric structural component.

7. A package for an electro-optical device, comprising:
a substrate having a first end portion and a second end portion; and
a housing comprising:
   at least one optical element,
   a dielectric component including:
      a top portion, and
      a first side portion that extends orthogonally from the top portion,
         wherein the first side portion includes a first distal end that is connected to the first end portion of the substrate, and
      a second side portion that is opposite the first side portion and extends orthogonally from the top portion,
         wherein the second side portion includes a second distal end that is connected to the second end portion of the substrate,
   an electromagnetic interference (EMI) shield, and
   a plurality of conductive traces,
      wherein the dielectric component is configured to separate the EMI shield and the plurality of conductive traces.

8. The package of claim 7, wherein:
the dielectric component is a molded dielectric polymer; and
the EMI shield is a molded conductive polymer disposed on an exterior surface of the dielectric component.

9. The package of claim 7, wherein:
the dielectric component is a dielectric film; and
the EMI shield is a molded conductive polymer disposed on an exterior surface of the dielectric component.

10. The package of claim 7, wherein:
the EMI shield is disposed on an exterior surface of the dielectric component; and at least one conductive trace, of the plurality of conductive traces, is disposed on an interior surface of the dielectric component,
wherein the at least one conductive trace is electrically connected to the substrate and a conductive path associated with the optical element.

11. The package of claim 10, wherein:
a portion of the EMI shield is disposed on a first portion of a surface of the substrate; and
a portion of the at least one conductive trace is disposed on a second portion of the surface of the substrate.

12. The package of claim 10, wherein the housing further comprises an optics assembly that:
includes the conductive path associated with the optical element; and
is configured to hold the at least one optical element over a vertical cavity surface emitting laser (VCSEL) array of the substrate.

13. The package of claim 7, wherein:
the housing is connected to the substrate via an electrically conductive connecting material.

14. A package for a time-of-flight (ToF) device, comprising:
a substrate comprising a vertical cavity surface emitting laser (VCSEL) array disposed on a surface of the substrate; and
a housing comprising:
at least one optical element,
a dielectric component including:
a top portion, and
a first side portion that extends orthogonally from the top portion,
wherein the first side portion includes a first distal end that is connected to a first end portion of the substrate, and
a second side portion that is opposite the first side portion and extends orthogonally from the top portion,
wherein the second side portion includes a second distal end that is connected to a second end portion of the substrate,
an electromagnetic interference (EMI) shield disposed on an exterior surface of the dielectric component, and
a conductive trace disposed on an interior surface of the dielectric component.

15. The package of claim 14, wherein the housing further comprises:
an optics assembly that holds the at least one optical element over the VCSEL array of the substrate,
wherein the conductive trace is electrically connected to the substrate and a conductive path associated with the optics assembly.

16. The package of claim 14, wherein the conductive trace is electrically connected to the substrate and a conductive path associated with the at least one optical element.

17. The package of claim 14, wherein the dielectric component is a molded dielectric polymer or a dielectric film.

18. The package of claim 14, wherein:
a portion of the EMI shield is electrically connected to a first portion of the surface of the substrate via a first connecting material; and
a portion of the conductive trace is electrically connected to a second portion of the surface of the substrate via a second connecting material.

19. The package of claim 14, wherein the conductive trace is a laser direct structuring trace.

20. The housing of claim 14, wherein a portion of the conductive trace is electrically connected to a conductive path associated with the at least one optical element via a connecting material.

\* \* \* \* \*